(12) United States Patent
Sarwer et al.

(10) Patent No.: US 12,363,276 B2
(45) Date of Patent: Jul. 15, 2025

(54) SIGN DATA HIDING OF VIDEO RECORDING

(71) Applicant: ALIBABA GROUP HOLDING LIMITED, Grand Cayman (KY)

(72) Inventors: Mohammed Golam Sarwer, Cupertino, CA (US); Yan Ye, San Diego, CA (US)

(73) Assignee: Alibaba Group Holding Limited, Grand Cayman (KY)

( * ) Notice: Subject to any disclaimer, the term of this patent is extended or adjusted under 35 U.S.C. 154(b) by 523 days.

(21) Appl. No.: 17/211,340

(22) Filed: Mar. 24, 2021

(65) Prior Publication Data

US 2021/0306623 A1 Sep. 30, 2021

Related U.S. Application Data

(60) Provisional application No. 62/994,239, filed on Mar. 24, 2020.

(51) Int. Cl.
| | |
|---|---|
| *H04N 7/12* | (2006.01) |
| *H03M 7/30* | (2006.01) |
| *H04N 19/105* | (2014.01) |
| *H04N 19/172* | (2014.01) |
| *H04N 19/176* | (2014.01) |
| *H04N 19/467* | (2014.01) |

(52) U.S. Cl.
CPC ........ *H04N 19/105* (2014.11); *H03M 7/3053* (2013.01); *H03M 7/6011* (2013.01); *H04N 19/172* (2014.11); *H04N 19/176* (2014.11); *H04N 19/467* (2014.11)

(58) Field of Classification Search
CPC .................................................... H04N 19/12
See application file for complete search history.

(56) References Cited

U.S. PATENT DOCUMENTS

| | | | |
|---|---|---|---|
| 2013/0294524 A1 | 11/2013 | Van Der Auwera et al. | |
| 2019/0110058 A1 | 4/2019 | Chien et al. | |
| 2020/0020134 A1 | 1/2020 | Tsukuba | |
| 2023/0007267 A1 | 1/2023 | Yoo et al. | |
| 2023/0106242 A1 | 4/2023 | Naser et al. | |
| 2023/0128378 A1 | 4/2023 | Hsiang | |

FOREIGN PATENT DOCUMENTS

| | | |
|---|---|---|
| JP | 2021150703 A | 9/2021 |
| JP | 2022500924 A | 1/2022 |
| JP | 2023516617 A | 4/2023 |
| JP | 2023517695 A | 4/2023 |
| WO | 2018173798 A1 | 9/2018 |

(Continued)

OTHER PUBLICATIONS

Bross et al., "Versatile Video Coding (Draft 8)," JVET-Q2001-vD, 17th Meeting: Brussels, BE, Jan. 7-17, 2020, 509 pages.

(Continued)

*Primary Examiner* — Y Lee
(74) *Attorney, Agent, or Firm* — Finnegan, Henderson, Farabow, Garrett & Dunner, LLP

(57) ABSTRACT

In a method of encoding a video sequence into a bitstream, an encoder determines, based on a value of a first encoded flag, whether to encode a second flag into the bitstream. The first flag indicates whether sign data hiding is turned off at a slice level for a video frame. The second flag indicates whether transform skip residual coding is turned off at the slice level for the video frame.

23 Claims, 29 Drawing Sheets

(56) References Cited

FOREIGN PATENT DOCUMENTS

| WO | 2020056356 A1 | 3/2020 |
| WO | 2021172912 A1 | 9/2021 |
| WO | 2021172914 A1 | 9/2021 |
| WO | 2021180710 A1 | 9/2021 |

OTHER PUBLICATIONS

Chen et al., "Algorithm Description of Joint Exploration Test Model 7 (JEM 7)," JVET-G1001-v1, 7th Meeting: Torino, IT, Jul. 13-21, 2017, 50 pages.

Chen et al., "Algorithm Description of Joint Exploration Test Model 8 (JEM 8)," JVET-Q2002-v1, 17th Meeting: Brussels, BE, Jan. 7-17, 2020, 91 pages.

International Telecommunications Union "Series H: Audiovisual and Multimedia Systems Infrastructure of audiovisual services—Coding of moving video", ITU-T Telecommunication Standardization Sector of ITU, Apr. 2013, 317 pages.

Nalci et al., "CE3-2.3: Luma BDPCM for Lossless Coding using Regular Residual Coding," JVET-Q0088-v1, 17th Meeting: Brussels, BE, Jan. 7-17, 2020, 3 pages.

Segall et al., "Joint Call for Proposals on Video Compression with Capability beyond HEVC," JVET-H1002 (v6), 8th Meeting: Macao, CN, Oct. 18-24, 2017, 27 pages.

Sullivan et al., "Overview of the High Efficiency Video Coding (HEVC) Standard," IEE Transactions on Circuits and Systems for Video Technology, vol. 22, No. 12, pp. 1649-1668 (2012).

PCT International Search Report and Written Opinion mailed Jun. 4, 2021, issued in corresponding International Application No. PCT/US2021/023926 (8 pgs.).

European Patent Office Communication issued for Application No. 21776922.3 the Supplementary European Search Report (Art. 153(7) EPC) and the European search opinion dated Dec. 6, 2023, 11 pages.

Japanese Office Action issued in corresponding Japanese Application No. 2022-554702 on Jan. 21, 2025 (10 pages).

Japanese Search Report issued in corresponding Japanese Application No. 2022-554702 on Jan. 15, 2025 (41 pages).

Lee et al., "Fast Transform Skip Mode Decision for HEVC Screen Content Coding," 2015 IEEE International Symposium on Broadband Multimedia Systems and Broadcasting, IEEE, 2015, pp. 104.

Nalci et al., "AHG9: High-level constraints on dependent quantization and sigh data hiding," JVET-R0271-v3, 18th Meeting by teleconference, Apr. 15-24, 2020, 4 pages.

Ma et al., "Lossless coding for Vvc," JVET-O1061, 15th Meeting: Gothenburg, SE, Jul. 3-12, 2019, 18 pages.

Pastuszak et al., "Algorithm and Architecture Design of the H.265/HEVC Intra Encoder," IEEE Transactions on Circuits and Systems for Video Technology, Vo. 26, No. 1, Jan. 2016, pp. 210-222.

| | pic_sign_data_hiding_enabled_flag == 1 | |
|---|---|---|
| | slice_ts_residual_coding_disabled_flag == 0 | slice_ts_residual_coding_disabled_flag == 1 |
| Transform_skip_flag == 1 (TS and BDPCM blocks) | SDH is disabled | SDH is enabled |

| Quantized residual | | | | | Horizontal BDPCM | | | | | Inverse Horizontal BDPCM | | | | | Error | | | |
|---|---|---|---|---|---|---|---|---|---|---|---|---|---|---|---|---|---|---|
| 14 | -13 | 11 | -12 | | 14 | -27 | 24 | -23 | | 14 | -13 | 11 | -12 | | 0 | 0 | 0 | 0 |
| 10 | -11 | -1 | 5 | | 10 | -21 | 10 | 6 | | 10 | -11 | -1 | 5 | | 0 | 0 | 0 | 0 |
| 0 | -10 | 12 | 14 | | 0 | -10 | 22 | 2 | | 0 | -10 | 12 | 14 | | 0 | 0 | 0 | 0 |
| 15 | 14 | -10 | -12 | | 15 | -1 | -24 | -2 | | 15 | 14 | -10 | -12 | | 0 | 0 | 0 | 0 |

Sum of abs value: 211

FIG. 6B

| Quantized residual | | | | | Horizontal BDPCM | | | | | Inverse Horizontal BDPCM | | | | | Error | | | |
|---|---|---|---|---|---|---|---|---|---|---|---|---|---|---|---|---|---|---|
| 14 | -13 | 11 | -12 | | 14 | -27 | 24 | -23 | | 14 | -13 | 11 | -12 | | 0 | 0 | 0 | 0 |
| 10 | -11 | -1 | 5 | | 10 | -22 | 10 | 6 | | 10 | -12 | -2 | 4 | | 0 | -1 | -1 | -1 |
| 0 | -10 | 12 | 14 | | 0 | -10 | 22 | 2 | | 0 | -10 | 12 | 14 | | 0 | 0 | 0 | 0 |
| 15 | 14 | -10 | -12 | | 15 | -1 | -24 | -2 | | 15 | 14 | -10 | -12 | | 0 | 0 | 0 | 0 |

Sum of abs value: 212

|  | pic_sign_data_hiding_enabled_flag == 1 | |
|---|---|---|
|  | slice_ts_residual_coding_disabled_flag == 0 | slice_ts_residual_coding_disabled_flag == 1 |
| transform_skip_flag == 1 (all TS blocks including non-BDPCM and BDPCM blocks) | Disabled | Disabled |

FIG. 7

| | Descriptor |
|---|---|
| residual_coding( x0, y0, log2TbWidth, log2TbHeight, cIdx ) { | |
| ... | |
| if( ~~ph_dep_quant_enabled_flag~~ || !pic_sign_data_hiding_enabled_flag || *transform_skip_flag[ x0 ][ y0 ][ cIdx ]*) | |
| signHidden = 0 | |
| else | |
| signHidden = ( lastSigScanPosSb − firstSigScanPosSb > 3 ? 1 : 0 ) | |
| ... | |
| } | |

FIG. 8

| | pic_sign_data_hiding_enabled_flag == 1 | |
|---|---|---|
| | slice_ts_residual_coding_disabled_flag == 0 | slice_ts_residual_coding_disabled_flag == 1 |
| transform_skip_flag == 1 && BdpcmFlag == 0 | Disabled | Enabled |
| transform_skip_flag == 1 && BdpcmFlag == 1 | Disabled | Disabled |

FIG. 9

| | Descriptor |
|---|---|
| residual_coding( x0, y0, log2TbWidth, log2TbHeight, cIdx ) { | |
| ... | |
| if( ~~ph_dep_quant_enabled_flag~~ || !pic_sign_data_hiding_enabled_flag || *BdpcmFlag[ x0 ][ y0 ][ cIdx ]* ) | |
|   signHidden = 0 | |
| else | |
|   signHidden = ( lastSigScanPosSb − firstSigScanPosSb > 3 ? 1 : 0 ) | |
| ... | |
| } | |

FIG. 10

| | Descriptor |
|---|---|
| residual_coding( x0, y0, log2TbWidth, log2TbHeight, cIdx ) { | |
| ... | |
| if( ~~ph_dep_quant_enabled_flag~~ \|\| !pic_sign_data_hiding_enabled_flag \|\| *slice_ts_residual_coding_disabled_flag* ) | |
|   signHidden = 0 | |
| else | |
|   signHidden = ( lastSigScanPosSb − firstSigScanPosSb > 3 ? 1 : 0 ) | |
| ... | |
| } | |

FIG. 11

| | Descriptor |
|---|---|
| slice_ts_residual_coding_disabled_flag | u(1) |
| if(pic_sign_data_hiding_enabled_flag && !slice_ts_residual_coding_disabled_flag) | |
| slice_sign_data_hiding_eanbled_dlag | u(1) |

FIG. 12

| | Descriptor |
|---|---|
| residual_coding( x0, y0, log2TbWidth, log2TbHeight, cIdx ) { | |
| ... | |
| if( ph_dep_quant_enabled_flag || !pic_sign_data_hiding_enabled_flag ! slice_sign_data_hiding_enabled_flag ) | |
| signHidden = 0 | |
| else | |
| signHidden = ( lastSigScanPosSb - firstSigScanPosSb > 3 ? 1 : 0 ) | |
| ... | |
| } | |

FIG. 13

| | Descriptor |
|---|---|
| if(pic_sign_data_hiding_enabled_flag) | |
| slice_sign_data_hiding_enabled_flag | |
| if(!slice_sign_data_hiding_enabled_flag) | |
| slice_ts_residual_coding_disabled_flag | |
| if( ph_lmcs_enabled_flag ) | |
| slice_lmcs_enabled_flag | |

FIG. 14

| | Descriptor |
|---|---|
| slice_header( ) { | |
|   if( ph_inter_slice_allowed_flag ) | |
|     slice_type | ue(v) |
|   *slice_lossless_flag* | u(1) |
|   if( sps_alf_enabled_flag && !alf_info_in_ph_flag && *!slice_lossless_flag* ) { | |
|     slice_alf_enabled_flag | u(1) |
|     if( slice_alf_enabled_flag ) { | |
|       slice_num_alf_aps_ids_luma | u(3) |
|       for( i = 0; i < slice_num_alf_aps_ids_luma; i++ ) | |
|         slice_alf_aps_id_luma[ i ] | u(3) |
|       if( ChromaArrayType != 0 ) | |
|         slice_alf_chroma_idc | u(2) |
|       if( slice_alf_chroma_idc ) | |
|         slice_alf_aps_id_chroma | u(3) |
|       if( sps_ccalf_enabled_flag ) { | |
|         slice_cc_alf_cb_enabled_flag | u(1) |
|         if( slice_cc_alf_cb_enabled_flag ) | |
|           slice_cc_alf_cb_aps_id | u(3) |
|         slice_cc_alf_cr_enabled_flag | u(1) |
|         if( slice_cc_alf_cr_enabled_flag ) | |
|           slice_cc_alf_cr_aps_id | u(3) |
|   ~ | |
|   ~ | |
|   ~ | |

FIG. 15 (Page 1 of 2)

| | Descriptor |
|---|---|
| if( sps_sao_enabled_flag && !sao_info_in_ph_flag && ! slice_lossless_flag ) { | |
| slice_sao_luma_flag | u(1) |
| if( ChromaArrayType != 0 ) | |
| slice_sao_chroma_flag | u(1) |
| } | |
| if( deblocking_filter_override_enabled_flag && !dbf_info_in_ph_flag && ! slice_lossless_flag ) | |
| slice_deblocking_filter_override_flag | u(1) |
| if( slice_deblocking_filter_override_flag ) { | |
| slice_deblocking_filter_disabled_flag | u(1) |
| if( !slice_deblocking_filter_disabled_flag ) { | |
| slice_beta_offset_div2 | se(v) |
| slice_tc_offset_div2 | se(v) |
| slice_cb_beta_offset_div2 | se(v) |
| slice_cb_tc_offset_div2 | se(v) |
| slice_cr_beta_offset_div2 | se(v) |
| slice_cr_tc_offset_div2 | se(v) |
| } | |
| } | |
| ~~slice_ts_residual_coding_disabled_flag~~ | |
| if( ph_lmcs_enabled_flag && ! slice_lossless_flag ) | u(1) |
| slice_lmcs_enabled_flag | u(1) |
| } | |

FIG. 15 (Page 2 of 2)

| | Descriptor |
|---|---|
| if( tu_cbf_luma[ x0 ][ y0 ] && treeType != DUAL_TREE_CHROMA ) { | |
|   if( sps_transform_skip_enabled_flag && !BdpcmFlag[ x0 ][ y0 ] && | |
|     tbWidth <= MaxTsSize && tbHeight <= MaxTsSize && | |
|     ( IntraSubPartitionsSplitType == ISP_NO_SPLIT ) && !cu_sbt_flag ) | |
|     transform_skip_flag[ x0 ][ y0 ] | ae(v) |
|   if( !transform_skip_flag[ x0 ][ y0 ] || ~~slice_is_residual_coding_disabled_flag~~ slice_lossless_flag ) | |
|     residual_coding( x0, y0, Log2( tbWidth ), Log2( tbHeight ), 0 ) | |
|   else | |
|     residual_ts_coding( x0, y0, Log2( tbWidth ), Log2( tbHeight ), 0 ) | |
| } | |
| if( tu_cbf_cb[ xC ][ yC ] && treeType != DUAL_TREE_LUMA ) { | |
|   if( sps_transform_skip_enabled_flag && !BdpcmFlag[ x0 ][ y0 ][ 1 ] && | |
|     wC <= MaxTsSize && hC <= MaxTsSize && !cu_sbt_flag ) | |
|     transform_skip_flag[ xC ][ yC ][ 1 ] | ae(v) |
|   if( !transform_skip_flag[ xC ][ yC ][ 1 ] || ~~slice_is_residual_coding_disabled_flag~~ slice_lossless_flag ) | |
|     residual_coding( xC, yC, Log2( wC ), Log2( hC ), 1 ) | |
|   else | |
|     residual_ts_coding( xC, yC, Log2( wC ), Log2( hC ), 1 ) | |
| } | |
| if( tu_cbf_cr[ xC ][ yC ] && treeType != DUAL_TREE_LUMA && | |
|   !( tu_cbf_cb[ xC ][ yC ] && tu_joint_cbcr_residual_flag[ xC ][ yC ] ) ) { | |
|   if( sps_transform_skip_enabled_flag && !BdpcmFlag[ x0 ][ y0 ][ 2 ] && | |
|     wC <= MaxTsSize && hC <= MaxTsSize && !cu_sbt_flag ) | |
|     transform_skip_flag[ xC ][ yC ][ 2 ] | ae(v) |
|   if( !transform_skip_flag[ xC ][ yC ][ 2 ] || ~~slice_is_residual_coding_disabled_flag~~ slice_lossless_flag ) | |
|     residual_coding( xC, yC, Log2( wC ), Log2( hC ), 2 ) | |
|   else | |
|     residual_ts_coding( xC, yC, Log2( wC ), Log2( hC ), 2 ) | |
| } | |

FIG. 16

| | Descriptor |
|---|---|
| if(!pic_sign_data_hiding_enabled_flag) | |
|   slice_ts_residual_coding_disabled_flag | u(1) |
| if( ph_lmcs_enabled_flag ) | |
|   slice_lmcs_enabled_flag | u(1) |
| ... | |

FIG. 17

| | Descriptor |
|---|---|
| if(ph_dep_quant_enabled_flag) | |
|   slice_ts_residual_coding_disabled_flag | u(1) |
| if( ph_lmcs_enabled_flag ) | |
|   slice_lmcs_enabled_flag | u(1) |
| | |
| | |
| | |

FIG. 18

SIGN DATA HIDING OF VIDEO RECORDING

CROSS-REFERENCE TO RELATED APPLICATIONS

The present disclosure claims the benefits of priority to U.S. Provisional Patent Application No. 62/994,239, filed on Mar. 24, 2020. The provisional application is incorporated herein by reference in its entirety.

TECHNICAL FIELD

The present disclosure generally relates to video data processing, and more particularly, to residual coding of video data.

BACKGROUND

A video is a set of static pictures (or "frames") capturing the visual information. To reduce the storage memory and the transmission bandwidth, a video can be compressed before storage or transmission and decompressed before display. The compression process is usually referred to as encoding and the decompression process is usually referred to as decoding. There are various video coding formats which use standardized video coding technologies, most commonly based on prediction, transform, quantization, entropy coding and in-loop filtering. The video coding standards, such as the High Efficiency Video Coding (e.g., HEVC/H.265) standard, the Versatile Video Coding (e.g., VVC/H.266) standard, and AVS standards, specifying the specific video coding formats, are developed by standardization organizations. With more and more advanced video coding technologies being adopted in the video standards, the coding efficiency of the new video coding standards get higher and higher.

SUMMARY OF THE DISCLOSURE

Embodiments of the present disclosure provide a method for video data coding, the method comprises: receiving a video frame for residual coding; determining whether the video frame is coded according to a transform skip mode at a transform block level; and in response to a determination that the video frame is coded according to the transform skip mode, turning off sign data hiding for the residual coding.

Embodiments of the present disclosure further provide a method for video data coding, the method comprises: receiving a video frame for residual coding; determining whether the video frame is coded according to a block differential pulse-code modulation mode; and in response to a determination that the video frame is coded according to the block differential pulse-code modulation code, turning off sign data hiding for the residual coding.

Embodiments of the present disclosure further provide a method for video data coding, the method comprises: receiving a video frame for residual coding; determining whether the video frame is coded according to a transform skip residual coding mode at a slice level; and in response to a determination that the video frame is not coded according to the transform skip residual coding mode at the slice level, turning off sign data hiding for the residual coding.

Embodiments of the present disclosure further provide a method for video data coding, the method comprises: receiving a video frame for residual coding; determining whether sign data hiding is enabled at a picture level for the video frame and whether transform skip residual coding is disabled at a slice level for the video frame; and in response to a determination that the sign data hiding is enabled at the picture level for the video frame and the transform skip residual coding is enabled at the slice level for the video frame, turning on sign data hiding at the slice level for the video frame.

Embodiments of the present disclosure further provide a method for video data coding, the method comprises: receiving a video frame for residual coding; determining whether sign data hiding is enabled at a picture level for the video frame; in response to a determination that the sign data hiding is enabled at the picture level for the video frame, turning on sign data hiding at a slice level for the video frame; determining whether sign data hiding is turned off at the slice level for the video frame; and in response to a determination that the sign data hiding is turned off at the slice level for the video frame, turning off transform skip residual coding at the slice level for the video frame.

Embodiments of the present disclosure further provide a method for video data coding, the method comprises: receiving a video frame for residual coding; determining whether the video frame is coded in a lossless mode at a slice level; and in response to a determination that the video frame is coded in the lossless mode at the slice level, turning off one or more loop filters at the slice level.

Embodiments of the present disclosure further provide a method for video data coding, the method comprises: receiving a video frame for residual coding; determining whether sign data hiding is turned off at a picture level for the video frame; in response to a determination that the sign data hiding is turned off at the picture level for the video frame, turning off transform skip residual coding at a slice level for the video frame.

Embodiments of the present disclosure further provide a method for video data coding, the method comprises: receiving a video frame for residual coding; determining whether a dependent quantization is enabled for the video frame; in response to a determination that the dependent quantization is enabled for the video frame, turning off transform skip residual coding at a slice level for the video frame.

Embodiments of the present disclosure further provide a system for performing video data processing, the system comprising: a memory storing a set of instructions; and a processor configured to execute the set of instructions to cause the system to perform: receiving a video frame for residual coding; determining whether the video frame is coded according to a transform skip mode at a transform block level; and in response to a determination that the video frame is coded according to the transform skip mode, turning off sign data hiding for the residual coding.

Embodiments of the present disclosure further provide a system for performing video data processing, the system comprising: a memory storing a set of instructions; and a processor configured to execute the set of instructions to cause the system to perform: receiving a video frame for residual coding; determining whether the video frame is coded according to a block differential pulse-code modulation mode; and in response to a determination that the video frame is coded according to the block differential pulse-code modulation code, turning off sign data hiding for the residual coding.

Embodiments of the present disclosure further provide a system for performing video data processing, the system comprising: a memory storing a set of instructions; and a processor configured to execute the set of instructions to cause the system to perform: receiving a video frame for residual coding; determining whether the video frame is coded according to a transform skip residual coding mode at a slice level; and in response to a determination that the video frame is not coded according to the transform skip residual coding mode at the slice level, turning off sign data hiding for the residual coding.

Embodiments of the present disclosure further provide a system for performing video data processing, the system comprising: a memory storing a set of instructions; and a processor configured to execute the set of instructions to cause the system to perform: receiving a video frame for residual coding; determining whether sign data hiding is enabled at a picture level for the video frame and whether transform skip residual coding is disabled at a slice level for the video frame; and in response to a determination that the sign data hiding is enabled at the picture level for the video frame and the transform skip residual coding is enabled at the slice level for the video frame, turning on sign data hiding at the slice level for the video frame.

Embodiments of the present disclosure further provide a system for performing video data processing, the system comprising: a memory storing a set of instructions; and a processor configured to execute the set of instructions to cause the system to perform: receiving a video frame for residual coding; determining whether sign data hiding is enabled at a picture level for the video frame; in response to a determination that the sign data hiding is enabled at the picture level for the video frame, turning on sign data hiding at a slice level for the video frame; determining whether sign data hiding is turned off at the slice level for the video frame; and in response to a determination that the sign data hiding is turned off at the slice level for the video frame, turning off transform skip residual coding at the slice level for the video frame.

Embodiments of the present disclosure further provide a system for performing video data processing, the system comprising: a memory storing a set of instructions; and a processor configured to execute the set of instructions to cause the system to perform: receiving a video frame for residual coding; determining whether the video frame is coded in a lossless mode at a slice level; and in response to a determination that the video frame is coded in the lossless mode at the slice level, turning off one or more loop filters at the slice level.

Embodiments of the present disclosure further provide a system for performing video data processing, the system comprising: a memory storing a set of instructions; and a processor configured to execute the set of instructions to cause the system to perform: receiving a video frame for residual coding; determining whether sign data hiding is turned off at a picture level for the video frame; in response to a determination that the sign data hiding is turned off at the picture level for the video frame, turning off transform skip residual coding at a slice level for the video frame.

Embodiments of the present disclosure further provide a system for performing video data processing, the system comprising: a memory storing a set of instructions; and a processor configured to execute the set of instructions to cause the system to perform: receiving a video frame for residual coding; determining whether a dependent quantization is enabled for the video frame; in response to a determination that the dependent quantization is enabled for the video frame, turning off transform skip residual coding at a slice level for the video frame.

Embodiments of the present disclosure further provide a non-transitory computer readable medium that stores a set of instructions that is executable by one or more processors of an apparatus to cause the apparatus to initiate a method for performing video data processing, the method comprising: receiving a video frame for residual coding; determining whether the video frame is coded according to a transform skip mode at a transform block level; and in response to a determination that the video frame is coded according to the transform skip mode, turning off sign data hiding for the residual coding.

Embodiments of the present disclosure further provide a non-transitory computer readable medium that stores a set of instructions that is executable by one or more processors of an apparatus to cause the apparatus to initiate a method for performing video data processing, the method comprising: receiving a video frame for residual coding; determining whether the video frame is coded according to a block differential pulse-code modulation mode, and in response to a determination that the video frame is coded according to the block differential pulse-code modulation code, turning off sign data hiding for the residual coding.

Embodiments of the present disclosure further provide a non-transitory computer readable medium that stores a set of instructions that is executable by one or more processors of an apparatus to cause the apparatus to initiate a method for performing video data processing, the method comprising: receiving a video frame for residual coding; determining whether the video frame is coded according to a transform skip residual coding mode at a slice level; and in response to a determination that the video frame is not coded according to the transform skip residual coding mode at the slice level, turning off sign data hiding for the residual coding.

Embodiments of the present disclosure further provide a non-transitory computer readable medium that stores a set of instructions that is executable by one or more processors of an apparatus to cause the apparatus to initiate a method for performing video data processing, the method comprising: receiving a video frame for residual coding; determining whether sign data hiding is enabled at a picture level for the video frame and whether transform skip residual coding is disabled at a slice level for the video frame; and in response to a determination that the sign data hiding is enabled at the picture level for the video frame and the transform skip residual coding is enabled at the slice level for the video frame, turning on sign data hiding at the slice level for the video frame.

Embodiments of the present disclosure further provide a non-transitory computer readable medium that stores a set of instructions that is executable by one or more processors of an apparatus to cause the apparatus to initiate a method for performing video data processing, the method comprising: receiving a video frame for residual coding; determining whether sign data hiding is enabled at a picture level for the video frame; in response to a determination that the sign data hiding is enabled at the picture level for the video frame, turning on sign data hiding at a slice level for the video frame; determining whether sign data hiding is turned off at the slice level for the video frame; and in response to a determination that the sign data hiding is turned off at the slice level for the video frame, turning off transform skip residual coding at the slice level for the video frame.

Embodiments of the present disclosure further provide a non-transitory computer readable medium that stores a set of instructions that is executable by one or more processors of an apparatus to cause the apparatus to initiate a method for performing video data processing, the method comprising: receiving a video frame for residual coding; determining whether the video frame is coded in a lossless mode at a slice level; and in response to a determination that the video frame is coded in the lossless mode at the slice level, turning off one or more loop filters at the slice level.

Embodiments of the present disclosure further provide a non-transitory computer readable medium that stores a set of instructions that is executable by one or more processors of an apparatus to cause the apparatus to initiate a method for performing video data processing, the method comprising: receiving a video frame for residual coding; determining whether sign data hiding is turned off at a picture level for the video frame, in response to a determination that the sign data hiding is turned off at the picture level for the video frame, turning off transform skip residual coding at a slice level for the video frame.

Embodiments of the present disclosure further provide a non-transitory computer readable medium that stores a set of instructions that is executable by one or more processors of an apparatus to cause the apparatus to initiate a method for performing video data processing, the method comprising: receiving a video frame for residual coding; determining whether a dependent quantization is enabled for the video frame; in response to a determination that the dependent quantization is enabled for the video frame, turning off transform skip residual coding at a slice level for the video frame.

BRIEF DESCRIPTION OF THE DRAWINGS

Embodiments and various aspects of the present disclosure are illustrated in the following detailed description and the accompanying figures. Various features shown in the figures are not drawn to scale.

FIG. 5 shows an exemplary table including supporting conditions to allow or disallow SDH for TS and BDPCM block, according to some embodiments of the present disclosure.

FIG. 6A shows an exemplary encoder adjustment of a BDPCM block prior to adjustment, according to some embodiments of the present disclosure.

FIG. 6B shows an exemplary encoder adjustment of a BDPCM block after adjustment, according to some embodiments of the present disclosure.

FIG. 7 shows an exemplary table including conditions to disable sign data hiding, according to some embodiments of the present disclosure.

FIG. 8 shows an exemplary syntax including a part of a residual coding syntax, according to some embodiments of the present disclosure.

FIG. 9 shows an exemplary table including conditions to allow sign data hiding for transform-skip mode and block differential pulse-code modulation mode, according to some embodiments of the present disclosure.

FIG. 10 shows an exemplary syntax including a part of a residual coding syntax for conditions shown in FIG. 9, according to some embodiments of the present disclosure.

FIG. 11 shows an exemplary syntax including a part of a residual coding syntax for disabling sign data hiding, according to some embodiments of the present disclosure.

FIG. 12 shows an exemplary syntax including a part of a slice header syntax for control of slice level sign data hiding flag, according to some embodiments of the present disclosure.

FIG. 13 shows an exemplary syntax including a part of a residual coding syntax for control of a slice level sign data hiding flag, according to some embodiments of the present disclosure.

FIG. 14 shows an exemplary syntax including a part of a slice header syntax for slice level sign data hiding flag, according to some embodiments of the present disclosure.

FIG. 15 shows an exemplary syntax including a part of a slice header syntax for a slice level lossless flag, according to some embodiments of the present disclosure.

FIG. 16 shows an exemplary syntax including a part of a residual coding syntax for a slice level lossless flag, according to some embodiments of the present disclosure.

FIG. 17 shows an exemplary syntax including a part of a slice heading syntax with reduced syntax redundancy, according to some embodiments of the present disclosure.

FIG. 18 shows an exemplary syntax including a part of a slice header syntax for conditions of sign data hiding and dependent quantization, according to some embodiments of the present disclosure.

DETAILED DESCRIPTION

Figure 1:
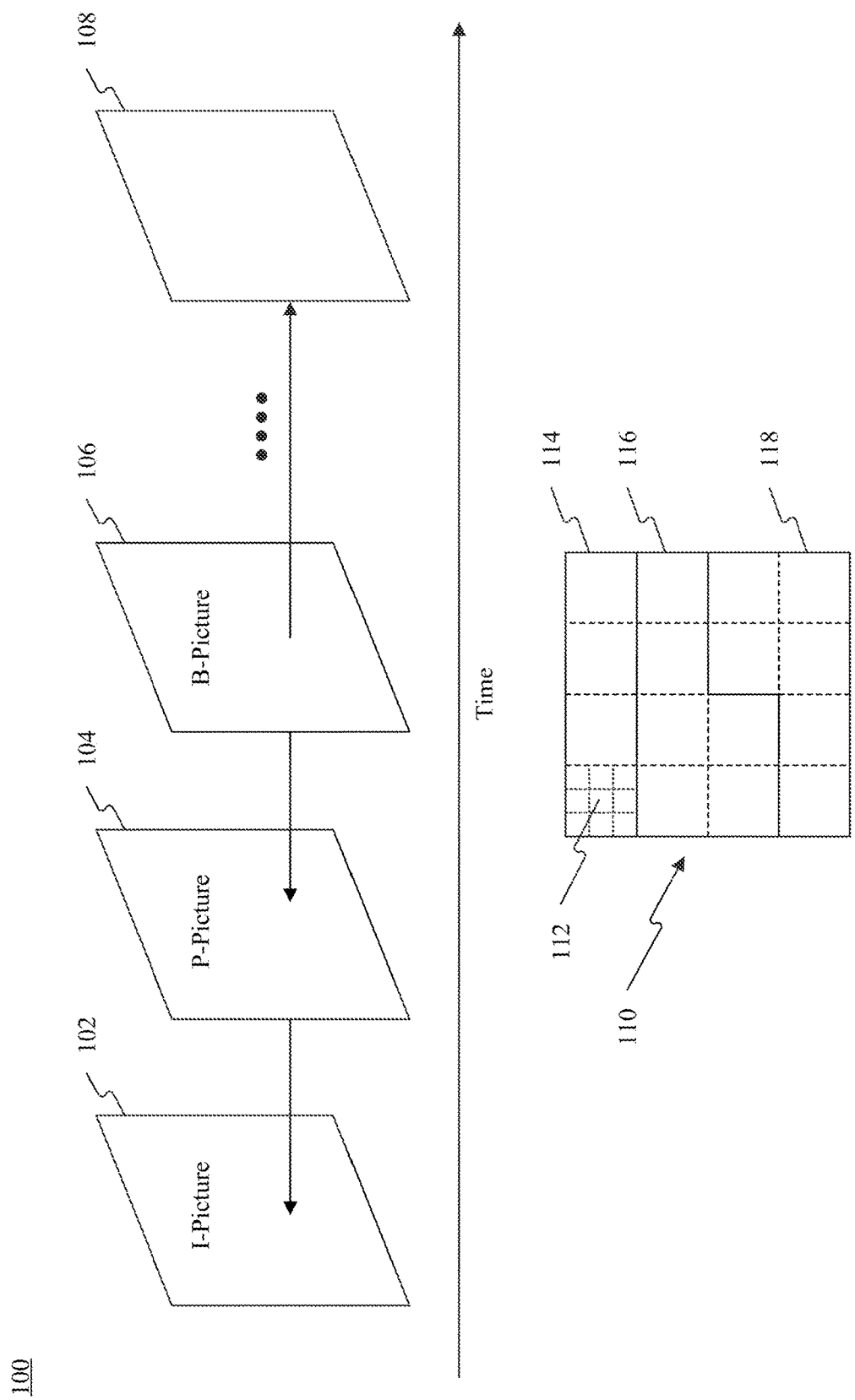
FIG. 1 shows structures of an example video sequence, according to some embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims. Particular aspects of the present disclosure are described in greater detail below. The terms and definitions provided herein control, if in conflict with terms and/or definitions incorporated by reference.

The Joint Video Experts Team (JVET) of the ITU-T Video Coding Expert Group (ITU-T VCEG) and the ISO/IEC Moving Picture Expert Group (ISO/IEC MPEG) is currently developing the Versatile Video Coding (VVC/H.266) standard. The VVC standard is aimed at doubling the compression efficiency of its predecessor, the High Efficiency Video Coding (HEVC/H.265) standard. In other words, VVC's goal is to achieve the same subjective quality as HEVC/H.265 using half the bandwidth.

In order to achieve the same subjective quality as HEVC/H.265 using half the bandwidth, the Joint Video Experts Team ("JVET") has been developing technologies beyond HEVC using the joint exploration model ("JEM") reference software. As coding technologies were incorporated into the JEM, the JEM achieved substantially higher coding performance than HEVC. The VCEG and MPEG have also formally started the development of a next generation video compression standard beyond HEVC.

The VVC standard has been developed recently and continues to include more coding technologies that provide better compression performance. VVC is based on the same hybrid video coding system that has been used in modern video compression standards such as HEVC, H.264/AVC, MPEG2, H.263, etc.

A video is a set of static pictures (or frames) arranged in a temporal sequence to store visual information. A video capture device (e.g., a camera) can be used to capture and store those pictures in a temporal sequence, and a video playback device (e.g., a television, a computer, a smartphone, a tablet computer, a video player, or any end-user terminal with a function of display) can be used to display such pictures in the temporal sequence. Also, in some applications, a video capturing device can transmit the captured video to the video playback device (e.g., a computer with a monitor) in real-time, such as for surveillance, conferencing, or live broadcasting.

To reduce the storage space and the transmission bandwidth needed by such applications, the video can be compressed. For example, the video can be compressed before storage and transmission and decompressed before the display. The compression and decompression can be implemented by software executed by a processor (e.g., a processor of a generic computer) or specialized hardware. The module or circuitry for compression is generally referred to as an "encoder," and the module or circuitry for decompression is generally referred to as a "decoder." The encoder and the decoder can be collectively referred to as a "codec." The encoder and the decoder can be implemented as any of a variety of suitable hardware, software, or a combination thereof. For example, the hardware implementation of the encoder and the decoder can include circuitry, such as one or more microprocessors, digital signal processors ("DSPs"), application-specific integrated circuits ("ASICs"), field-programmable gate arrays ("FPGAs"), discrete logic, or any combinations thereof. The software implementation of the encoder and the decoder can include program codes, computer-executable instructions, firmware, or any suitable computer-implemented algorithm or process fixed in a computer-readable medium. Video compression and decompression can be implemented by various algorithms or standards, such as MPEG-1, MPEG-2, MPEG-4, H.26x series, or the like. In some applications, the codec can decompress the video from a first coding standard and re-compress the decompressed video using a second coding standard, in which case the codec can be referred to as a "transcoder."

The video encoding process can identify and keep useful information that can be used to reconstruct a picture. If information that was disregarded in the video encoding process cannot be fully reconstructed, the encoding process can be referred to as "lossy." Otherwise, it can be referred to as "lossless." Most encoding processes are lossy, which is a tradeoff to reduce the needed storage space and the transmission bandwidth.

In many cases, the useful information of a picture being encoded (referred to as a "current picture") can include changes with respect to a reference picture (e.g., a picture previously encoded or reconstructed). Such changes can include position changes, luminosity changes, or color changes of the pixels. Position changes of a group of pixels that represent an object can reflect the motion of the object between the reference picture and the current picture.

A picture coded without referencing another picture (i.e., it is its own reference picture) is referred to as an "I-picture." A picture is referred to as a "P-picture" if some or all blocks (e.g., blocks that generally refer to portions of the video picture) in the picture are predicted using intra prediction or inter prediction with one reference picture (e.g., uni-prediction). A picture is referred to as a "B-picture" if at least one block in it is predicted with two reference pictures (e.g., bi-prediction).

FIG. 1 shows structures of an example video sequence, according to some embodiments of the present disclosure. As shown in FIG. 1, video sequence 100 can be a live video or a video having been captured and archived. Video 100 can be a real-life video, a computer-generated video (e.g., computer game video), or a combination thereof (e.g., a real-life video with augmented-reality effects). Video sequence 100 can be inputted from a video capture device (e.g., a camera), a video archive (e.g., a video file stored in a storage device) containing previously captured video, or a video feed interface (e.g., a video broadcast transceiver) to receive video from a video content provider.

As shown in FIG. 1, video sequence 100 can include a series of pictures arranged temporally along a timeline, including pictures 102, 104, 106, and 108. Pictures 102-106 are continuous, and there are more pictures between pictures 106 and 108. In FIG. 1, picture 102 is an I-picture, the reference picture of which is picture 102 itself. Picture 104 is a P-picture, the reference picture of which is picture 102, as indicated by the arrow. Picture 106 is a B-picture, the reference pictures of which are pictures 104 and 108, as indicated by the arrows. In some embodiments, the reference picture of a picture (e.g., picture 104) can be not immediately preceding or following the picture. For example, the reference picture of picture 104 can be a picture preceding picture 102. It should be noted that the reference pictures of pictures 102-106 are only examples, and the present disclosure does not limit embodiments of the reference pictures as the examples shown in FIG. 1.

Typically, video codecs do not encode or decode an entire picture at one time due to the computing complexity of such tasks. Rather, they can split the picture into basic segments, and encode or decode the picture segment by segment. Such basic segments are referred to as basic processing units ("BPUs") in the present disclosure. For example, structure 110 in FIG. 1 shows an example structure of a picture of video sequence 100 (e.g., any of pictures 102-108). In structure 110, a picture is divided into 4×4 basic processing units, the boundaries of which are shown as dash lines. In some embodiments, the basic processing units can be referred to as "macroblocks" in some video coding standards (e.g., MPEG family, H.261, H.263, or H.264/AVC), or as "coding tree units" ("CTUs") in some other video coding standards (e.g., H.265/HEVC or H.266/VVC). The basic processing units can have variable sizes in a picture, such as 128×128, 64-64, 32×32, 16×16, 4×8, 16×32, or any arbitrary shape and size of pixels. The sizes and shapes of the basic processing units can be selected for a picture based on the balance of coding efficiency and levels of details to be kept in the basic processing unit.

The basic processing units can be logical units, which can include a group of different types of video data stored in a computer memory (e.g., in a video frame buffer). For example, a basic processing unit of a color picture can include a luma component (Y) representing achromatic brightness information, one or more chroma components (e.g., Cb and Cr) representing color information, and associated syntax elements, in which the luma and chroma components can have the same size of the basic processing unit. The luma and chroma components can be referred to as "coding tree blocks" ("CTBs") in some video coding standards (e.g., H.265/HEVC or H.266/VVC). Any operation performed to a basic processing unit can be repeatedly performed to each of its luma and chroma components.

Video coding has multiple stages of operations, examples of which are shown in FIGS. 2A-2B and FIGS. 3A-3B. For each stage, the size of the basic processing units can still be too large for processing, and thus can be further divided into segments referred to as "basic processing sub-units" in the present disclosure. In some embodiments, the basic processing sub-units can be referred to as "blocks" in some video coding standards (e.g., MPEG family, H.261, H.263, or H.264/AVC), or as "coding units" ("CUs") in some other video coding standards (e.g., H.265/HEVC or H.266/VVC). A basic processing sub-unit can have the same or smaller size than the basic processing unit. Similar to the basic processing units, basic processing sub-units are also logical units, which can include a group of different types of video data (e.g., Y, Cb, Cr, and associated syntax elements) stored in a computer memory (e.g., in a video frame buffer). Any operation performed to a basic processing sub-unit can be repeatedly performed to each of its luma and chroma components. It should be noted that such division can be performed to further levels depending on processing needs. It should also be noted that different stages can divide the basic processing units using different schemes.

Figure 2A:
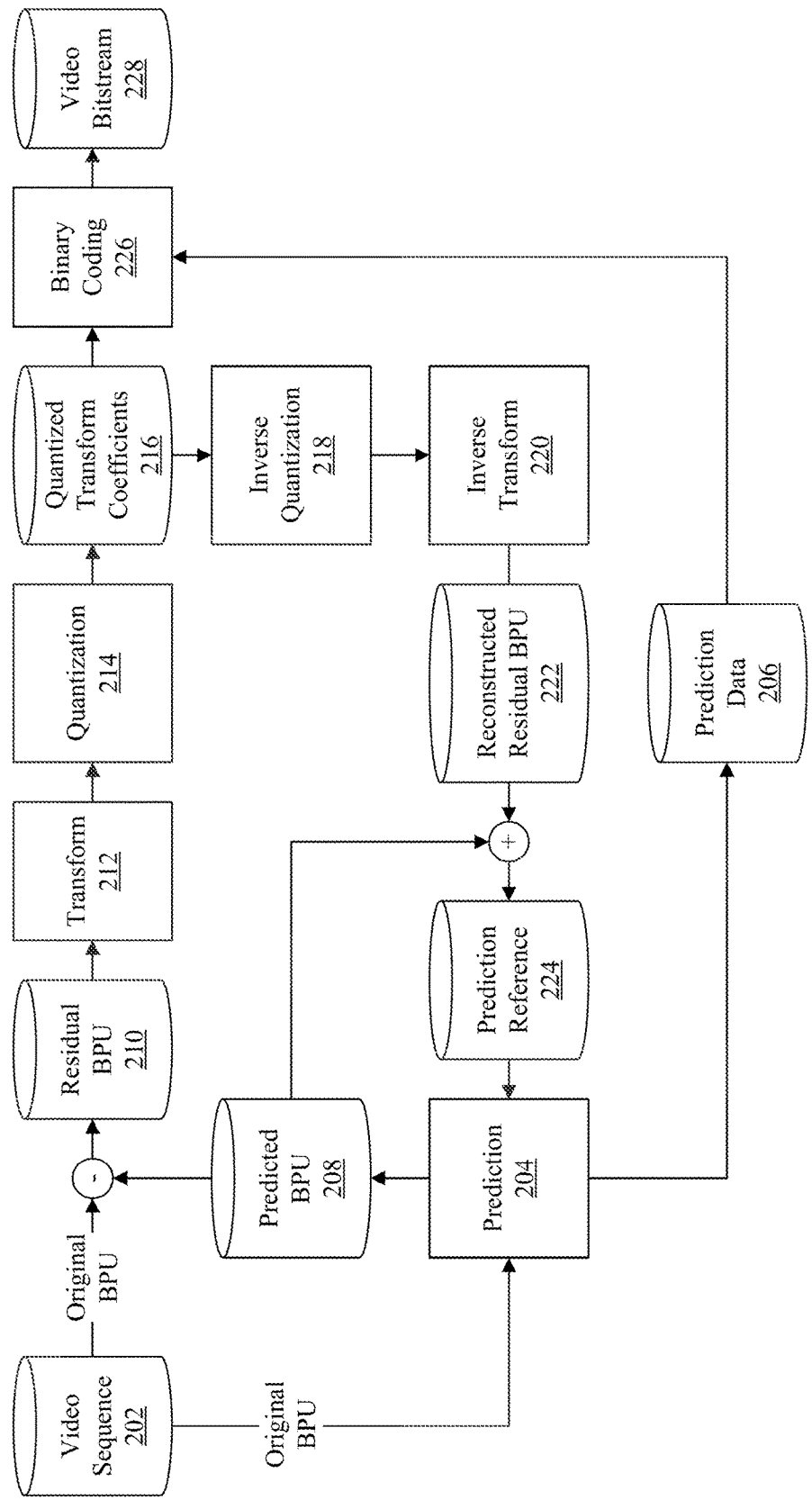
FIG. 2A shows a schematic of an example encoding process, according to some embodiments of the present disclosure.
Figure 2B:
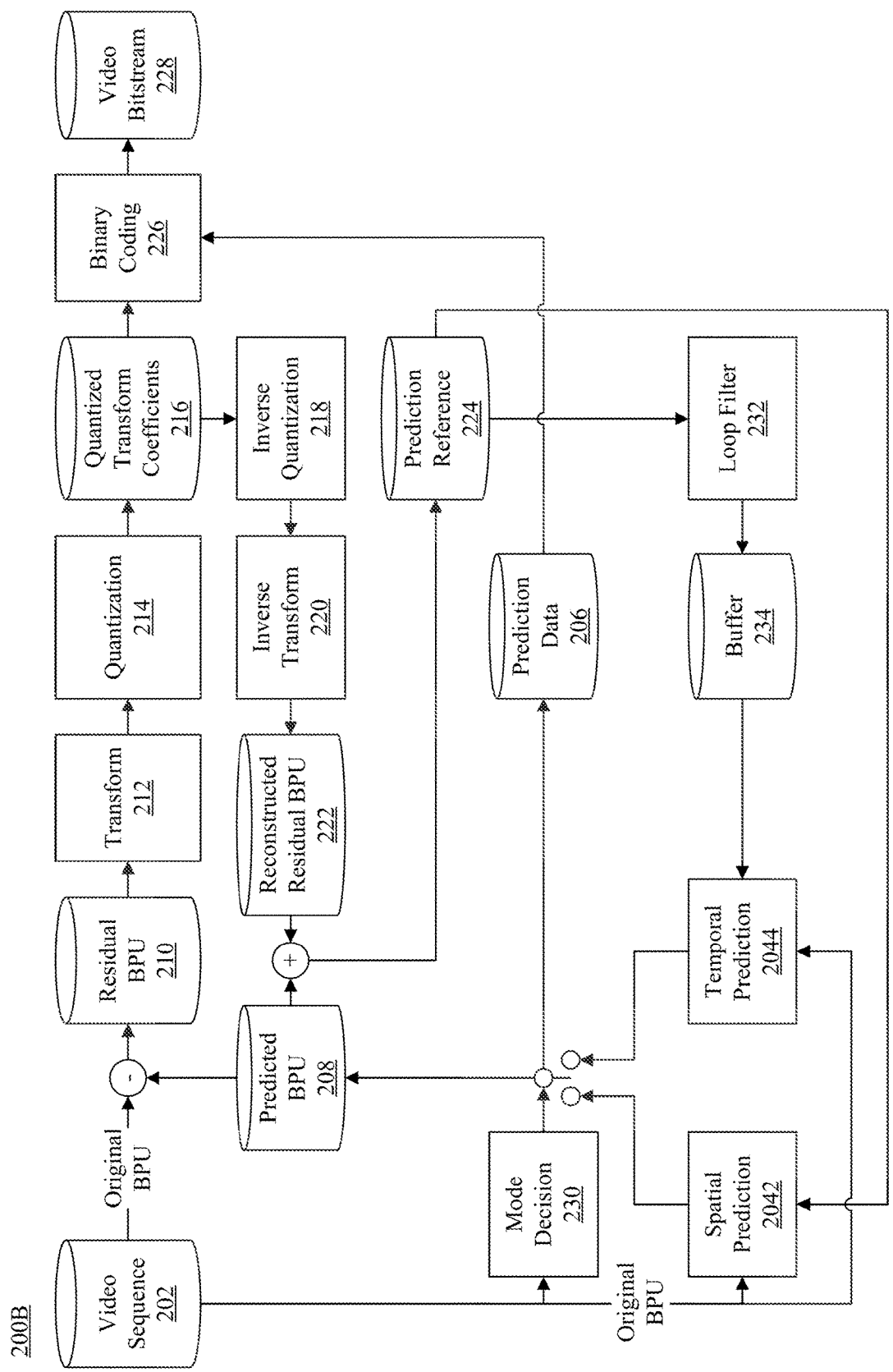
FIG. 2B shows a schematic of another example encoding process, according to some embodiments of the present disclosure.

For example, at a mode decision stage (an example of which is shown in FIG. 2B), the encoder can decide what prediction mode (e.g., intra-picture prediction or inter-picture prediction) to use for a basic processing unit, which can be too large to make such a decision. The encoder can split the basic processing unit into multiple basic processing sub-units (e.g., CUs as in H.265/HEVC or H.266/VVC), and decide a prediction type for each individual basic processing sub-unit.

For another example, at a prediction stage (an example of which is shown in FIGS. 2A-2B), the encoder can perform prediction operation at the level of basic processing sub-units (e.g., CUs). However, in some cases, a basic processing sub-unit can still be too large to process. The encoder can further split the basic processing sub-unit into smaller segments (e.g., referred to as "prediction blocks" or "PBs" in H.265/HEVC or H.266/VVC), at the level of which the prediction operation can be performed.

For another example, at a transform stage (an example of which is shown in FIGS. 2A-2B), the encoder can perform a transform operation for residual basic processing sub-units (e.g., CUs). However, in some cases, a basic processing sub-unit can still be too large to process. The encoder can further split the basic processing sub-unit into smaller segments (e.g., referred to as "transform blocks" or "TBs" in H.265/HEVC or H.266/VVC), at the level of which the transform operation can be performed. It should be noted that the division schemes of the same basic processing sub-unit can be different at the prediction stage and the transform stage. For example, in H.265/HEVC or H.266/VVC, the prediction blocks and transform blocks of the same CU can have different sizes and numbers.

In structure 110 of FIG. 1, basic processing unit 112 is further divided into 3×3 basic processing sub-units, the boundaries of which are shown as dotted lines. Different basic processing units of the same picture can be divided into basic processing sub-units in different schemes.

In some implementations, to provide the capability of parallel processing and error resilience to video encoding and decoding, a picture can be divided into regions for processing, such that, for a region of the picture, the encoding or decoding process can depend on no information from any other region of the picture. In other words, each region of the picture can be processed independently. By doing so, the codec can process different regions of a picture in parallel, thus increasing the coding efficiency. Also, when data of a region is corrupted in the processing or lost in network transmission, the codec can correctly encode or decode other regions of the same picture without reliance on the corrupted or lost data, thus providing the capability of error resilience. In some video coding standards, a picture can be divided into different types of regions. For example, H.265/HEVC and H.266/VVC provide two types of regions; "slices" and "tiles." It should also be noted that different pictures of video sequence 100 can have different partition schemes for dividing a picture into regions.

For example, in FIG. 1, structure 110 is divided into three regions 114, 116, and 118, the boundaries of which are shown as solid lines inside structure 110. Region 114 includes four basic processing units. Each of regions 16 and 118 includes six basic processing units. It should be noted that the basic processing units, basic processing sub-units, and regions of structure 110 in FIG. 1 are only examples, and the present disclosure does not limit embodiments thereof.

FIG. 2A shows a schematic of an example encoding process, according to some embodiments of the present disclosure. For example, encoding process 200A shown in FIG. 2A can be performed by an encoder. As shown in FIG. 2A, the encoder can encode video sequence 202 into video bitstream 228 according to process 200A. Similar to video sequence 100 in FIG. 1, video sequence 202 can include a set of pictures (referred to as "original pictures") arranged in a temporal order. Similar to structure 110 in FIG. 1, each original picture of video sequence 202 can be divided by the encoder into basic processing units, basic processing sub-units, or regions for processing. In some embodiments, the encoder can perform process 200A at the level of basic processing units for each original picture of video sequence 202. For example, the encoder can perform process 200A in an iterative manner, in which the encoder can encode a basic processing unit in one iteration of process 200A. In some embodiments, the encoder can perform process 200A in parallel for regions (e.g., regions 114-118) of each original picture of video sequence 202.

In FIG. 2A, the encoder can feed a basic processing unit (referred to as an "original BPU") of an original picture of video sequence 202 to prediction stage 204 to generate prediction data 206 and predicted BPU 208. The encoder can subtract predicted BPU 208 from the original BPU to generate residual BPU 210. The encoder can feed residual BPU 210 to transform stage 212 and quantization stage 214 to generate quantized transform coefficients 216. The encoder can feed prediction data 206 and quantized transform coefficients 216 to binary coding stage 226 to generate video bitstream 228. Components 202, 204, 206, 208, 210, 212, 214, 216, 226, and 228 can be referred to as a "forward path." During process 200A, after quantization stage 214, the encoder can feed quantized transform coefficients 216 to inverse quantization stage 218 and inverse transform stage 220 to generate reconstructed residual BPU 222. The encoder can add reconstructed residual BPU 222 to predicted BPU 208 to generate prediction reference 224, which is used in prediction stage 204 for the next iteration of process 200A. Components 218, 220, 222, and 224 of process 200A can be referred to as a "reconstruction path." The reconstruction path can be used to ensure that both the encoder and the decoder use the same reference data for prediction.

The encoder can perform process 200A iteratively to encode each original BPU of the original picture (in the forward path) and generate predicted reference 224 for encoding the next original BPU of the original picture (in the reconstruction path). After encoding all original BPUs of the original picture, the encoder can proceed to encode the next picture in video sequence 202.

Referring to process 200A, the encoder can receive video sequence 202 generated by a video capturing device (e.g., a camera). The term "receive" used herein can refer to receiving, inputting, acquiring, retrieving, obtaining, reading, accessing, or any action in any manner for inputting data.

At prediction stage 204, at a current iteration, the encoder can receive an original BPU and prediction reference 224, and perform a prediction operation to generate prediction data 206 and predicted BPU 208. Prediction reference 224 can be generated from the reconstruction path of the previous iteration of process 200A. The purpose of prediction stage 204 is to reduce information redundancy by extracting prediction data 206 that can be used to reconstruct the original BPU as predicted BPU 208 from prediction data 206 and prediction reference 224.

Ideally, predicted BPU 208 can be identical to the original BPU. However, due to non-ideal prediction and reconstruction operations, predicted BPU 208 is generally slightly different from the original BPU. For recording such differences, after generating predicted BPU 208, the encoder can subtract it from the original BPU to generate residual BPU 210. For example, the encoder can subtract values (e.g., greyscale values or RGB values) of pixels of predicted BPU 208 from values of corresponding pixels of the original BPU. Each pixel of residual BPU 210 can have a residual value as a result of such subtraction between the corresponding pixels of the original BPU and predicted BPU 208. Compared with the original BPU, prediction data 206 and residual BPU 210 can have fewer bits, but they can be used to reconstruct the original BPU without significant quality deterioration. Thus, the original BPU is compressed.

To further compress residual BPU 210, at transform stage 212, the encoder can reduce spatial redundancy of residual BPU 210 by decomposing it into a set of two-dimensional "base patterns," each base pattern being associated with a "transform coefficient." The base patterns can have the same size (e.g., the size of residual BPU 210). Each base pattern can represent a variation frequency (e.g., frequency of brightness variation) component of residual BPU 210. None of the base patterns can be reproduced from any combinations (e.g., linear combinations) of any other base patterns. In other words, the decomposition can decompose variations of residual BPU 210 into a frequency domain. Such a decomposition is analogous to a discrete Fourier transform of a function, in which the base patterns are analogous to the base functions (e.g., trigonometry functions) of the discrete Fourier transform, and the transform coefficients are analogous to the coefficients associated with the base functions.

Different transform algorithms can use different base patterns. Various transform algorithms can be used at transform stage 212, such as, for example, a discrete cosine transform, a discrete sine transform, or the like. The transform at transform stage 212 is invertible. That is, the encoder can restore residual BPU 210 by an inverse operation of the transform (referred to as an "inverse transform"). For example, to restore a pixel of residual BPU 210, the inverse transform can be multiplying values of corresponding pixels of the base patterns by respective associated coefficients and adding the products to produce a weighted sum. For a video coding standard, both the encoder and decoder can use the same transform algorithm (thus the same base patterns). Thus, the encoder can record only the transform coefficients, from which the decoder can reconstruct residual BPU 210 without receiving the base patterns from the encoder. Compared with residual BPU 210, the transform coefficients can have fewer bits, but they can be used to reconstruct residual BPU 210 without significant quality deterioration. Thus, residual BPU 210 is further compressed.

The encoder can further compress the transform coefficients at quantization stage 214. In the transform process, different base patterns can represent different variation frequencies (e.g., brightness variation frequencies). Because human eyes are generally better at recognizing low-frequency variation, the encoder can disregard information of high-frequency variation without causing significant quality deterioration in decoding. For example, at quantization stage 214, the encoder can generate quantized transform coefficients 216 by dividing each transform coefficient by an integer value (referred to as a "quantization scale parameter") and rounding the quotient to its nearest integer. After such an operation, some transform coefficients of the high-frequency base patterns can be converted to zero, and the transform coefficients of the low-frequency base patterns can be converted to smaller integers. The encoder can disregard the zero-value quantized transform coefficients 216, by which the transform coefficients are further compressed. The quantization process is also invertible, in which quantized transform coefficients 216 can be reconstructed to the transform coefficients in an inverse operation of the quantization (referred to as "inverse quantization").

Because the encoder disregards the remainders of such divisions in the rounding operation, quantization stage 214 can be lossy. Typically, quantization stage 214 can contribute the most information loss in process 200A. The larger the information loss is, the fewer bits the quantized transform coefficients 216 can need. For obtaining different levels of information loss, the encoder can use different values of the quantization scale factor or any other parameter of the quantization process.

At binary coding stage 226, the encoder can encode prediction data 206 and quantized transform coefficients 216 using a binary coding technique, such as, for example, entropy coding, variable length coding, arithmetic coding, Huffman coding, context-adaptive binary arithmetic coding, or any other lossless or lossy compression algorithm. In some embodiments, besides prediction data 206 and quantized transform coefficients 216, the encoder can encode other information at binary coding stage 226, such as, for example, a prediction mode used at prediction stage 204, parameters of the prediction operation, a transform type at transform stage 212, parameters of the quantization process (e.g., quantization scale factors), an encoder control parameter (e.g., a bitrate control parameter), or the like. The encoder can use the output data of binary coding stage 226 to generate video bitstream 228. In some embodiments, video bitstream 228 can be further packetized for network transmission.

Referring to the reconstruction path of process 200A, at inverse quantization stage 218, the encoder can perform inverse quantization on quantized transform coefficients 216 to generate reconstructed transform coefficients. At inverse transform stage 220, the encoder can generate reconstructed residual BPU 222 based on the reconstructed transform coefficients. The encoder can add reconstructed residual BPU 222 to predicted BPU 208 to generate prediction reference 224 that is to be used in the next iteration of process 200A.

It should be noted that other variations of the process 200A can be used to encode video sequence 202. In some embodiments, stages of process 200A can be performed by the encoder in different orders. In some embodiments, one or more stages of process 200A can be combined into a single stage. In some embodiments, a single stage of process 200A can be divided into multiple stages. For example, transform stage 212 and quantization stage 214 can be combined into a single stage. In some embodiments, process 200A can include additional stages. In some embodiments, process 200A can omit one or more stages in FIG. 2A.

FIG. 2B shows a schematic of another example encoding process, according to some embodiments of the present disclosure. As shown in FIG. 2B, process 200B can be modified from process 200A. For example, process 200B can be used by an encoder conforming to a hybrid video coding standard (e.g., H.26x series). Compared with process 200A, the forward path of process 200B additionally includes mode decision stage 230 and divides prediction stage 204 into spatial prediction stage 2042 and temporal prediction stage 2044. The reconstruction path of process 200B additionally includes loop filter stage 232 and buffer 234.

Generally, prediction techniques can be categorized into two types: spatial prediction and temporal prediction. Spatial prediction (e.g., an intra-picture prediction or "intra prediction") can use pixels from one or more already coded neighboring BPUs in the same picture to predict the current BPU. That is, prediction reference 224 in the spatial prediction can include the neighboring BPUs. The spatial prediction can reduce the inherent spatial redundancy of the picture. Temporal prediction (e.g., an inter-picture prediction or "inter prediction") can use regions from one or more already coded pictures to predict the current BPU. That is, prediction reference 224 in the temporal prediction can include the coded pictures. The temporal prediction can reduce the inherent temporal redundancy of the pictures.

Referring to process 200B, in the forward path, the encoder performs the prediction operation at spatial prediction stage 2042 and temporal prediction stage 2044. For example, at spatial prediction stage 2042, the encoder can perform the intra prediction. For an original BPU of a picture being encoded, prediction reference 224 can include one or more neighboring BPUs that have been encoded (in the forward path) and reconstructed (in the reconstructed path) in the same picture. The encoder can generate predicted BPU 208 by extrapolating the neighboring BPUs. The extrapolation technique can include, for example, a linear extrapolation or interpolation, a polynomial extrapolation or interpolation, or the like. In some embodiments, the encoder can perform the extrapolation at the pixel level, such as by extrapolating values of corresponding pixels for each pixel of predicted BPU 208. The neighboring BPUs used for extrapolation can be located with respect to the original BPU from various directions, such as in a vertical direction (e.g., on top of the original BPU), a horizontal direction (e.g., to the left of the original BPU), a diagonal direction (e.g., to the down-left, down-right, up-left, or up-right of the original BPU), or any direction defined in the used video coding standard. For the intra prediction, prediction data 206 can include, for example, locations (e.g., coordinates) of the used neighboring BPUs, sizes of the used neighboring BPUs, parameters of the extrapolation, a direction of the used neighboring BPUs with respect to the original BPU, or the like.

For another example, at temporal prediction stage 2044, the encoder can perform the inter prediction. For an original BPU of a current picture, prediction reference 224 can include one or more pictures (referred to as "reference pictures") that have been encoded (in the forward path) and reconstructed (in the reconstructed path). In some embodiments, a reference picture can be encoded and reconstructed BPU by BPU. For example, the encoder can add reconstructed residual BPU 222 to predicted BPU 208 to generate a reconstructed BPU. When all reconstructed BPUs of the same picture are generated, the encoder can generate a reconstructed picture as a reference picture. The encoder can perform an operation of "motion estimation" to search for a matching region in a scope (referred to as a "search window") of the reference picture. The location of the search window in the reference picture can be determined based on the location of the original BPU in the current picture. For example, the search window can be centered at a location having the same coordinates in the reference picture as the original BPU in the current picture and can be extended out for a predetermined distance. When the encoder identifies (e.g., by using a pel-recursive algorithm, a block-matching algorithm, or the like) a region similar to the original BPU in the search window, the encoder can determine such a region as the matching region. The matching region can have different dimensions (e.g., being smaller than, equal to, larger than, or in a different shape) from the original BPU. Because the reference picture and the current picture are temporally separated in the timeline (e.g., as shown in FIG. 1), it can be deemed that the matching region "moves" to the location of the original BPU as time goes by. The encoder can record the direction and distance of such a motion as a "motion vector." When multiple reference pictures are used (e.g., as picture 106 in FIG. 1), the encoder can search for a matching region and determine its associated motion vector for each reference picture. In some embodiments, the encoder can assign weights to pixel values of the matching regions of respective matching reference pictures.

The motion estimation can be used to identify various types of motions, such as, for example, translations, rotations, zooming, or the like. For inter prediction, prediction data 206 can include, for example, locations (e.g., coordinates) of the matching region, the motion vectors associated with the matching region, the number of reference pictures, weights associated with the reference pictures, or the like.

For generating predicted BPU 208, the encoder can perform an operation of "motion compensation." The motion compensation can be used to reconstruct predicted BPU 208 based on prediction data 206 (e.g., the motion vector) and prediction reference 224. For example, the encoder can move the matching region of the reference picture according to the motion vector, in which the encoder can predict the original BPU of the current picture. When multiple reference pictures are used (e.g., as picture 106 in FIG. 1), the encoder can move the matching regions of the reference pictures according to the respective motion vectors and average pixel values of the matching regions. In some embodiments, if the encoder has assigned weights to pixel values of the matching regions of respective matching reference pictures, the encoder can add a weighted sum of the pixel values of the moved matching regions.

In some embodiments, the inter prediction can be unidirectional or bidirectional. Unidirectional inter predictions can use one or more reference pictures in the same temporal direction with respect to the current picture. For example, picture 104 in FIG. 1 is a unidirectional inter-predicted picture, in which the reference picture (i.e., picture 102) precedes picture 104. Bidirectional inter predictions can use one or more reference pictures at both temporal directions with respect to the current picture. For example, picture 106 in FIG. 1 is a bidirectional inter-predicted picture, in which the reference pictures (i.e., pictures 104 and 108) are at both temporal directions with respect to picture 104.

Still referring to the forward path of process 200B, after spatial prediction stage 2042 and temporal prediction stage 2044, at mode decision stage 230, the encoder can select a prediction mode (e.g., one of the intra prediction or the inter prediction) for the current iteration of process 200B. For example, the encoder can perform a rate-distortion optimization technique, in which the encoder can select a prediction mode to minimize a value of a cost function depending on a bit rate of a candidate prediction mode and distortion of the reconstructed reference picture under the candidate prediction mode. Depending on the selected prediction mode, the encoder can generate the corresponding predicted BPU 208 and predicted data 206.

In the reconstruction path of process 200B, if intra prediction mode has been selected in the forward path, after generating prediction reference 224 (e.g., the current BPU that has been encoded and reconstructed in the current picture), the encoder can directly feed prediction reference 224 to spatial prediction stage 2042 for later usage (e.g., for extrapolation of a next BPU of the current picture). The encoder can feed prediction reference 224 to loop filter stage 232, at which the encoder can apply a loop filter to prediction reference 224 to reduce or eliminate distortion (e.g., blocking artifacts) introduced during coding of the prediction reference 224. The encoder can apply various loop filter techniques at loop filter stage 232, such as, for example, deblocking, sample adaptive offsets, adaptive loop filters, or the like. The loop-filtered reference picture can be stored in buffer 234 (or "decoded picture buffer") for later use (e.g., to be used as an inter-prediction reference picture for a future picture of video sequence 202). The encoder can store one or more reference pictures in buffer 234 to be used at temporal prediction stage 2044. In some embodiments, the encoder can encode parameters of the loop filter (e.g., a loop filter strength) at binary coding stage 226, along with quantized transform coefficients 216, prediction data 206, and other information.

Figure 3A:
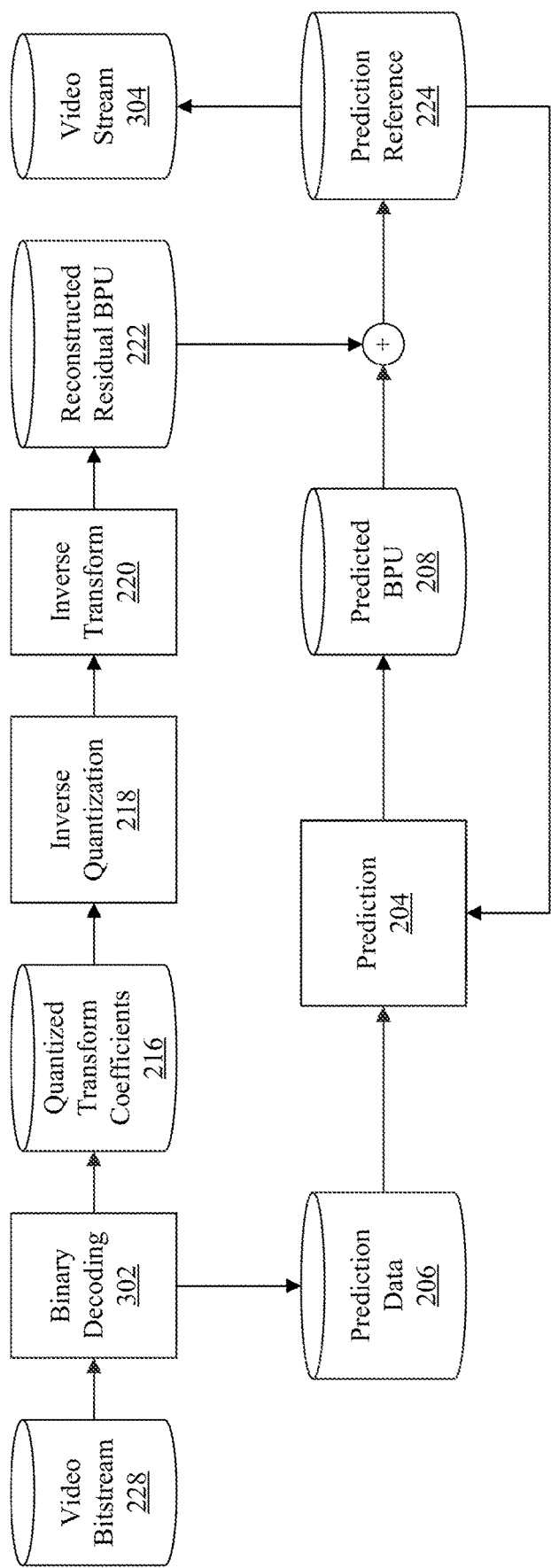
FIG. 3A shows a schematic of an example decoding process, according to some embodiments of the present disclosure.

FIG. 3A shows a schematic of an example decoding process, according to some embodiments of the present disclosure. As shown in FIG. 3A, process 300A can be a decompression process corresponding to the compression process 200A in FIG. 2A. In some embodiments, process 300A can be similar to the reconstruction path of process 200A. A decoder can decode video bitstream 228 into video stream 304 according to process 300A. Video stream 304 can be very similar to video sequence 202. However, due to the information loss in the compression and decompression process (e.g., quantization stage 214 in FIGS. 2A-2B), generally, video stream 304 is not identical to video sequence 202. Similar to processes 200A and 200B in FIGS. 2A-2B, the decoder can perform process 300A at the level of basic processing units (BPUs) for each picture encoded in video bitstream 228. For example, the decoder can perform process 300A in an iterative manner, in which the decoder can decode a basic processing unit in one iteration of process 300A. In some embodiments, the decoder can perform process 300A in parallel for regions (e.g., regions 114-118) of each picture encoded in video bitstream 228.

In FIG. 3A, the decoder can feed a portion of video bitstream 228 associated with a basic processing unit (referred to as an "encoded BPU") of an encoded picture to binary decoding stage 302. At binary decoding stage 302, the decoder can decode the portion into prediction data 206 and quantized transform coefficients 216. The decoder can feed quantized transform coefficients 216 to inverse quantization stage 218 and inverse transform stage 220 to generate reconstructed residual BPU 222. The decoder can feed prediction data 206 to prediction stage 204 to generate predicted BPU 208. The decoder can add reconstructed residual BPU 222 to predicted BPU 208 to generate predicted reference 224. In some embodiments, predicted reference 224 can be stored in a buffer (e.g., a decoded picture buffer in a computer memory). The decoder can feed predicted reference 224 to prediction stage 204 for performing a prediction operation in the next iteration of process 300A.

The decoder can perform process 300A iteratively to decode each encoded BPU of the encoded picture and generate predicted reference 224 for encoding the next encoded BPU of the encoded picture. After decoding all encoded BPUs of the encoded picture, the decoder can output the picture to video stream 304 for display and proceed to decode the next encoded picture in video bitstream 228.

At binary decoding stage 302, the decoder can perform an inverse operation of the binary coding technique used by the encoder (e.g., entropy coding, variable length coding, arithmetic coding, Huffman coding, context-adaptive binary arithmetic coding, or any other lossless compression algorithm). In some embodiments, besides prediction data 206 and quantized transform coefficients 216, the decoder can decode other information at binary decoding stage 302, such as, for example, a prediction mode, parameters of the prediction operation, a transform type, parameters of the quantization process (e.g., quantization scale factors), an encoder control parameter (e.g., a bitrate control parameter), or the like. In some embodiments, if video bitstream 228 is transmitted over a network in packets, the decoder can depacketize video bitstream 228 before feeding it to binary decoding stage 302.

Figure 3B:
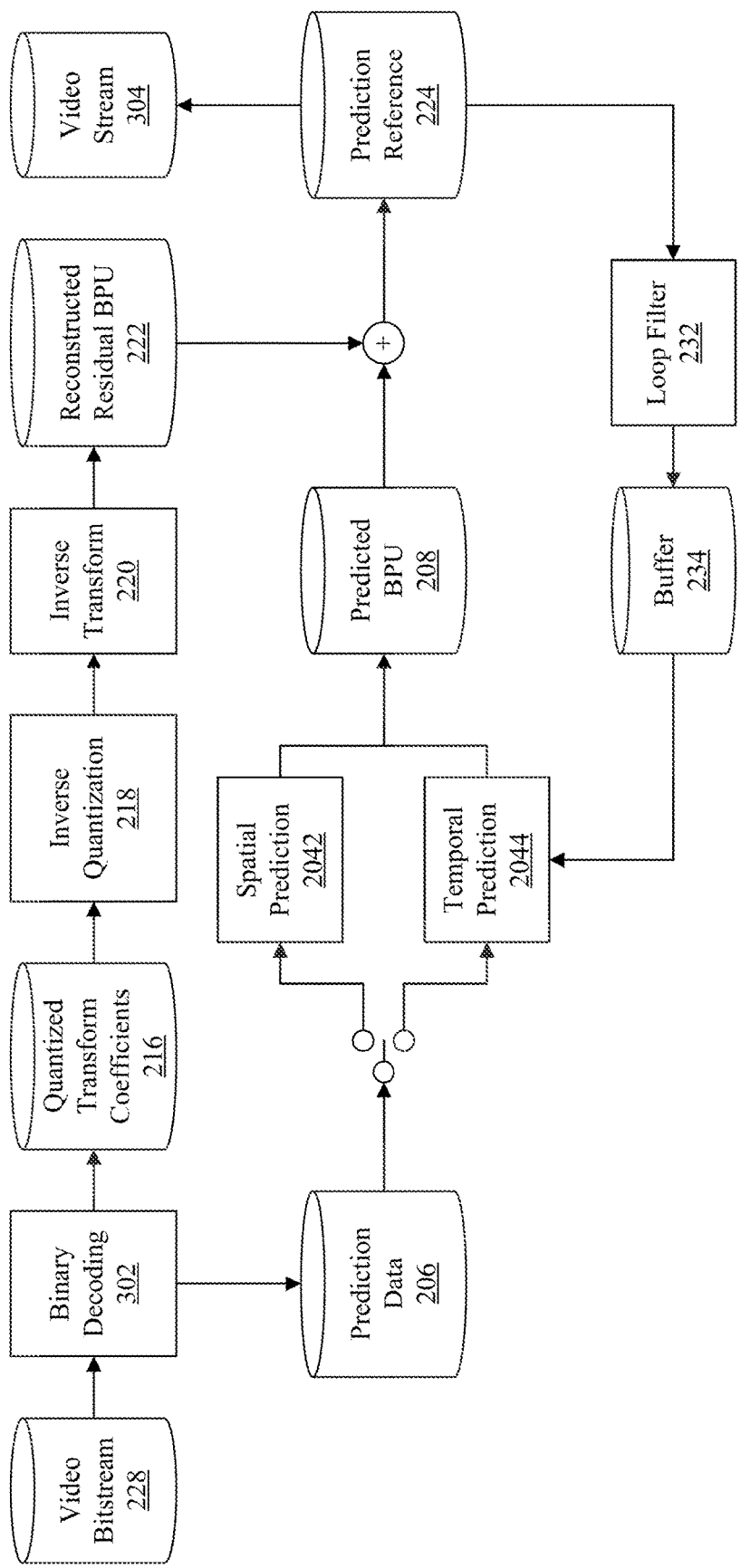
FIG. 3B shows a schematic of another example decoding process, according to some embodiments of the present disclosure.

FIG. 3B shows a schematic of another example decoding process, according to some embodiments of the present disclosure. As shown in FIG. 3B, process 300B can be modified from process 300A. For example, process 300B can be used by a decoder conforming to a hybrid video coding standard (e.g., H.26x series). Compared with process 300A, process 300B additionally divides prediction stage 204 into spatial prediction stage 2042 and temporal prediction stage 2044, and additionally includes loop filter stage 232 and buffer 234.

In process 300B, for an encoded basic processing unit (referred to as a "current BPU") of an encoded picture (referred to as a "current picture") that is being decoded, prediction data 206 decoded from binary decoding stage 302 by the decoder can include various types of data, depending on what prediction mode was used to encode the current BPU by the encoder. For example, if intra prediction was used by the encoder to encode the current BPU, prediction data 206 can include a prediction mode indicator (e.g., a flag value) indicative of the intra prediction, parameters of the intra prediction operation, or the like. The parameters of the intra prediction operation can include, for example, locations (e.g., coordinates) of one or more neighboring BPUs used as a reference, sizes of the neighboring BPUs, parameters of extrapolation, a direction of the neighboring BPUs with respect to the original BPU, or the like. For another example, if inter prediction was used by the encoder to encode the current BPU, prediction data 206 can include a prediction mode indicator (e.g., a flag value) indicative of the inter prediction, parameters of the inter prediction operation, or the like. The parameters of the inter prediction operation can include, for example, the number of reference pictures associated with the current BPU, weights respectively associated with the reference pictures, locations (e.g., coordinates) of one or more matching regions in the respective reference pictures, one or more motion vectors respectively associated with the matching regions, or the like.

Based on the prediction mode indicator, the decoder can decide whether to perform a spatial prediction (e.g., the intra prediction) at spatial prediction stage 2042 or a temporal prediction (e.g., the inter prediction) at temporal prediction stage 2044. The details of performing such spatial prediction or temporal prediction are described in FIG. 2B and will not be repeated hereinafter. After performing such spatial prediction or temporal prediction, the decoder can generate predicted BPU 208. The decoder can add predicted BPU 208 and reconstructed residual BPU 222 to generate prediction reference 224, as described in FIG. 3A.

In process 300B, the decoder can feed predicted reference 224 to spatial prediction stage 2042 or temporal prediction stage 2044 for performing a prediction operation in the next iteration of process 300B. For example, if the current BPU is decoded using the intra prediction at spatial prediction stage 2042, after generating prediction reference 224 (e.g., the decoded current BPU), the decoder can directly feed prediction reference 224 to spatial prediction stage 2042 for later usage (e.g., for extrapolation of a next BPU of the current picture). If the current BPU is decoded using the inter prediction at temporal prediction stage 2044, after generating prediction reference 224 (e.g., a reference picture in which all BPUs have been decoded), the decoder can feed prediction reference 224 to loop filter stage 232 to reduce or eliminate distortion (e.g., blocking artifacts). The decoder can apply a loop filter to prediction reference 224, in a way as described in FIG. 2B. The loop-filtered reference picture can be stored in buffer 234 (e.g., a decoded picture buffer in a computer memory) for later use (e.g., to be used as an inter-prediction reference picture for a future encoded picture of video bitstream 228). The decoder can store one or more reference pictures in buffer 234 to be used at temporal prediction stage 2044. In some embodiments, prediction data can further include parameters of the loop filter (e.g., a loop filter strength). In some embodiments, prediction data includes parameters of the loop filter when the prediction mode indicator of prediction data 206 indicates that inter prediction was used to encode the current BPU.

There can be four types of loop filters. For example, the loop filters can include a deblocking filter, a sample adaptive offsets ("SAO") filter, a luma mapping with chroma scaling ("LMCS") filter, and an adaptive loop filter ("ALF"). The order of applying the four types of loop filters can be the LMCS filter, the deblocking filter, the SAO filter, and the ALF. The LMCS filter can include two main components. The first component can be an in-loop mapping of the luma component based on adaptive piecewise linear models. The second component can be for the chroma components, and luma-dependent chroma residual scaling can be applied.

Figure 4:
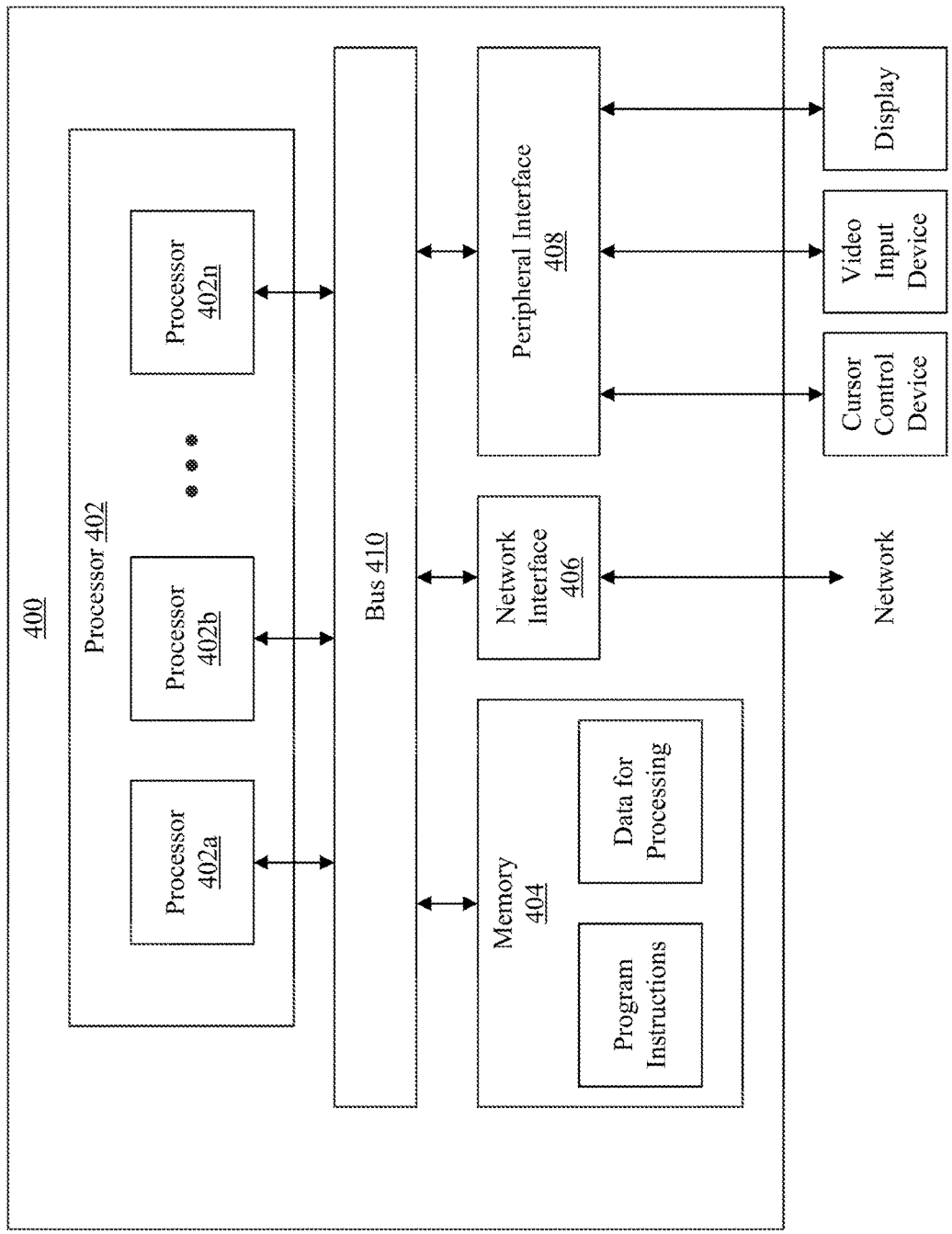
FIG. 4 shows a block diagram of an example apparatus for encoding or decoding a video, according to some embodiments of the present disclosure.

FIG. 4 shows a block diagram of an example apparatus for encoding or decoding a video, according to some embodiments of the present disclosure. As shown in FIG. 4, apparatus 400 can include processor 402. When processor 402 executes instructions described herein, apparatus 400 can become a specialized machine for video encoding or decoding. Processor 402 can be any type of circuitry capable of manipulating or processing information. For example, processor 402 can include any combination of any number of a central processing unit (or "CPU"), a graphics processing unit (or "GPU"), a neural processing unit ("NPU"), a microcontroller unit ("MCU"), an optical processor, a programmable logic controller, a microcontroller, a microprocessor, a digital signal processor, an intellectual property (IP) core, a Programmable Logic Array (PLA), a Programmable Array Logic (PAL), a Generic Array Logic (GAL), a Complex Programmable Logic Device (CPLD), a Field-Programmable Gate Array (FPGA), a System On Chip (SoC), an Application-Specific Integrated Circuit (ASIC), or the like. In some embodiments, processor 402 can also be a set of processors grouped as a single logical component. For example, as shown in FIG. 4, processor 402 can include multiple processors, including processor 402a, processor 402b, and processor 402n.

Apparatus 400 can also include memory 404 configured to store data (e.g., a set of instructions, computer codes, intermediate data, or the like). For example, as shown in FIG. 4, the stored data can include program instructions (e.g., program instructions for implementing the stages in processes 200A, 200B, 300A, or 300B) and data for processing (e.g., video sequence 202, video bitstream 228, or video stream 304). Processor 402 can access the program instructions and data for processing (e.g., via bus 410), and execute the program instructions to perform an operation or manipulation on the data for processing. Memory 404 can include a high-speed random-access storage device or a non-volatile storage device. In some embodiments, memory 404 can include any combination of any number of a random-access memory (RAM), a read-only memory (ROM), an optical disc, a magnetic disk, a hard drive, a solid-state drive, a flash drive, a security digital (SD) card, a memory stick, a compact flash (CF) card, or the like. Memory 404 can also be a group of memories (not shown in FIG. 4) grouped as a single logical component.

Bus 410 can be a communication device that transfers data between components inside apparatus 400, such as an internal bus (e.g., a CPU-memory bus), an external bus (e.g., a universal serial bus port, a peripheral component interconnect express port), or the like.

For case of explanation without causing ambiguity, processor 402 and other data processing circuits are collectively referred to as a "data processing circuit" in this disclosure. The data processing circuit can be implemented entirely as hardware, or as a combination of software, hardware, or firmware. In addition, the data processing circuit can be a single independent module or can be combined entirely or partially into any other component of apparatus 400.

Apparatus 400 can further include network interface 406 to provide wired or wireless communication with a network (e.g., the Internet, an intranet, a local area network, a mobile communications network, or the like). In some embodiments, network interface 406 can include any combination of any number of a network interface controller (NIC), a radio frequency (RF) module, a transponder, a transceiver, a modem, a router, a gateway, a wired network adapter, a wireless network adapter, a Bluetooth adapter, an infrared adapter, an near-field communication ("NFC") adapter, a cellular network chip, or the like.

In some embodiments, apparatus 400 can further include peripheral interface 408 to provide a connection to one or more peripheral devices. As shown in FIG. 4, the peripheral device can include, but is not limited to, a cursor control device (e.g., a mouse, a touchpad, or a touchscreen), a keyboard, a display (e.g., a cathode-ray tube display, a liquid crystal display, or a light-emitting diode display), a video input device (e.g., a camera or an input interface communicatively coupled to a video archive), or the like.

It should be noted that video codecs (e.g., a codec performing process 200A, 200B, 300A, or 300B) can be implemented as any combination of any software or hardware modules in apparatus 400. For example, some or all stages of process 200A, 200B, 300A, or 300B can be implemented as one or more software modules of apparatus 400, such as program instructions that can be loaded into memory 404. For another example, some or all stages of process 200A, 200B, 300A, or 300B can be implemented as one or more hardware modules of apparatus 400, such as a specialized data processing circuit (e.g., an FPGA, an ASIC, an NPU, or the like).

In the quantization and inverse quantization functional blocks (e.g., quantization 214 and inverse quantization 218 of FIG. 2A or FIG. 2B, inverse quantization 218 of FIG. 3A or FIG. 3B), a quantization parameter (QP) is used to determine the amount of quantization (and inverse quantization) applied to the prediction residuals. Initial QP values used for coding of a picture or slice can be signaled at the high level, for example, using init_qp_minus26 syntax element in the Picture Parameter Set (PPS) and using slice_qp_delta syntax element in the slice header. Further, the QP values can be adapted at the local level for each CU using delta QP values sent at the granularity of quantization groups.

In VVC transform skip mode, the residual blocks (e.g., the difference between the original and the predicted blocks) can be directly quantized and entropy coded. The transform process can be bypassed in a transform-skip ("TS") mode. For example, a variable transform_skip_flag can be signaled at a transform block level to indicate if TS mode is selected to be processed. The TS mode can be efficient for lossless compressions. For example, the TS mode can be efficient for camera captures or screen content sequences. In cases of lossy compressions, the TS mode can also improve the compression process for certain types of video content, such as computer-generated images or graphics mixed with camera-view content (e.g., scrolling text). A transform block is a block of samples resulting from a transform in a decoding process, and the transform is a process by which a block of transform coefficients is converted to a block of spatial domain values.

In addition to the TS mode, VVC also adopts a block differential pulse-code modulation ("BDPCM") mode. In the BDPCM mode, residual blocks can be directly quantized, and the delta between the quantized residual and its predictor quantized value can be entropy encoded. The predictor quantized value can be in a horizontal or vertical direction. A variable bdpcm_flag can be transmitted at the CU level to indicate if BDPCM is applied. If BDPCM is applied, another flag can be sent to signal the direction of the BDPCM mode (e.g., horizontal or vertical). In some examples, if BDPCM mode is selected, the value of the transform_skip_flag can be inferred to be 1, signaling that the transform process is bypassed for the current block.

In VVC (e.g., VVC draft 8), in addition to the scalar quantization, a dependent scalar quantization can also be used. In the dependent scalar quantization, a set of admissible reconstruction values for a transform coefficient depends on values of the transform coefficient levels that precede a current transform coefficient level in reconstruction order. A sequence parameter set ("SPS") level variable sps_dep_quant_enabled_flag can be used to enable a dependent quantization ("DQ") in the sequence level. If variable sps_dep_quant_enabled_flag is equal to 1, another picture level variable ph_dep_quant_enabled_flag can be sent to indicate that a scalar quantization is applied for the picture.

Sign data hiding ("SDH") is a mechanism in HEVC or in VVC (e.g., VVC draft 8) to reduce the number of coded signs. For each coefficient group ("CG"), encoding a sign of a last nonzero coefficient (e.g., in reverse scan order) can simply be omitted when SDH is enabled. Instead, the sign value can be embedded in the parity of the sum of the nonzero coefficient levels in the CG using predefined conventions. For example, an even sum can correspond to a positive parity (e.g., "+") and an odd sum can correspond to a negative parity (e.g., "−"). One criterion to use SDH is the distance between the first and the last nonzero coefficients of the CG in the scanning order. For example, if this distance is equal or larger than 4, SDH is used for that CG. In VVC (e.g., VVC draft 8), there is an SPS level gating variable sps_sign_data_hiding_enabled_flag that determines whether SDH is enabled for the current video sequence. If variable sps_sign_data_hiding_enabled_flag is equal to 1, another picture level variable pic_sign_data_hiding_enabled_flag can be signaled at a picture header to indicate if SDH is enabled in that picture.

The DQ and SDH can conflict with each other. Therefore, the VVC specification (e.g., VVC draft 8) does not allow both DQ and SDH to be enabled (e.g., sps_dep_quant_enabled_flag is equal to 1 and sps_sign_data_hiding_enabled_flag is equal to 1) for the same video sequence. For example, the sps_sign_data_hiding_enabled_flag can only be signaled if sps_dep_quant_enabled_flag is equal to 0. If sps_dcp_quant_enabled_flag is equal to 1, sps_sign_data_hiding_enabled_flag_is inferred to be 0.

In VVC coding (e.g., VVC draft 8), there are two residual coding methods, namely a regular residual coding method (e.g., residual_coding) and a transform-skip residual coding method (residual_ts_coding). In the regular residual coding, signs of each nonzero coefficient is coded in the third scan pass in bypass mode. The last sign in the CG can be coded or hidden depending on whether SDH is enabled for the CG. Both the TS blocks and the BDPCM blocks are allowed to select either regular residual coding or TS residual coding. If a slice level flag or variable slice_ts_residual_coding_disabled_flag has a value equal to 0, blocks coded in TS and BDPCM modes of that slice select residual_ts_coding as the residual coding process of the block. If the value of the slice level flag slice_ts_residual_coding_disabled_flag is equal to 1, the TS and BDPCM coded blocks of that slice select regular residual coding (e.g., residual_coding) method as the residual coding process of the block.

If both of the following conditions are satisfied, TS with non-BDPCM and TS with BDPCM blocks are allowed to use SDH: 1) variable slice_ts_residual_coding_disabled_flag is equal to 1, and 2) variable pic_sign_data_hiding_enabled_flag is equal to 1. When SDH is enabled, each CG of the entropy coded or decoded block should satisfy at least one of the following two conditions: 1) the sum of absolute values of coefficients is even and the sign of top-left coefficient is positive, or 2) the sum of absolute values of coefficients is odd and sign of top-left coefficient is negative. If none of the CG satisfies any one of the above mentioned conditions, the encoder can adjust the absolute value of one of the coefficients in the CG to guarantee that one of the above mentioned conditions is satisfied.

FIG. 5 shows an exemplary table including supporting conditions to allow or disallow SDH for TS and BDPCM block, according to some embodiments of the present disclosure. As shown in FIG. 5, SDH is disabled when pic_sign data_hiding_enabled_flag has a value of 1 and slice_ts_residual_coding_disabled_flag has a value of 0. SDH is enabled when pic_sign_data_hiding_enabled_flag has a value of 1 and slice_ts_residual_coding_disabled_flag has value of 1.

There are many issues with the current designs (e.g., VVC draft 8). First, the VVC design allows BDPCM blocks to use SDH, even though there is not an efficient encoding algorithm to adjust the coefficient values of BDPCM blocks to guarantee the above mentioned SDH conditions. FIG. 6A shows an exemplary encoder adjustment of a BDPCM block prior to adjustment, according to some embodiments of the present disclosure. FIG. 6B shows an exemplary encoder adjustment of a BDPCM block after adjustment, according to some embodiments of the present disclosure. Coefficients prior to the adjustment are shown in FIG. 6A. As shown in FIG. 6A, a sum of the coefficients of the horizontal BDPCM block is an odd number (e.g., 211), and the sign of the top-left coefficient (e.g., sign of number 14) is positive. This does not satisfy the necessary condition for SDH. As a result, an adjustment is required in encoding. Coefficients after the adjustment is shown in FIG. 6B. As shown in FIG. 6B, an encoder adjustment was made to change value −21 to −22 (shown in bold) in order to make the sum of absolute values an even number (e.g., 212). As a result. CG can satisfy the necessary condition for SDH. Changing one coefficient value, however, can affect a lot more coefficients. As shown in FIG. 6B, values −12, −2, 4, −1, −1, −1 shown in FIG. 6A have all been changed (shown in bold), and the error is propagated. This error propagation makes BDPCM with SDH less efficient in terms of compression performance.

Another issue with the current design of VVC (e.g., VVC draft 8) is an ability to perform lossless compression. In a lossless compression, the regular residual coding (e.g., variable slice_ts_residual_coding_disabled_flag being equal to 1) can achieve a higher compression gain than the TS residual coding (e.g., variable slice_ts_residual_coding_disabled_flag being equal to 0). As a result, one of the important usages of the condition slice_ts_residual_coding_disabled_flag being equal to 1 is for a lossless compression. Since SDH is a lossy coding tool, it is unable to always produce lossless results. To achieve a lossless compression, sign data hiding may need to be disallowed. As an alternative approach, the combination of slice_ts_residual_coding_disabled_flag=1 and sign data hiding may be disallowed.

Syntax redundancy is another issue. The VVC (e.g., VVC draft 8) specification supports a combination of conditions slice_ts_residual_coding_disabled_flag being equal to 1 and pic_sign_data_hiding_enabled_flag being equal to 1. However, based on the drawbacks mentioned above, the combination of the regular residual coding (e.g., slice_ts_residual_coding_disabled_flag being equal 1) with the sign data hiding (e.g., pic_sign_data_hiding_enabled_flag being equal to 1) is not a useful configuration. As a result, disallowing this combination can reduce syntax redundancy.

Embodiments of the present disclosure provide a method to combat the issues described above. In some embodiments, SDH is disabled for both TS with non-BDPCM blocks and TS with BDPCM blocks, regardless of the value of slice_ts_residual_coding_disabled_flag. FIG. 7 shows an exemplary table including conditions to disable sign data hiding, according to some embodiments of the present disclosure. As shown in FIG. 7, variable transform_skip_flag is set to 1 regardless of the values for variable slice_ts_residual_coding_disabled_flag. It is asserted that if a block is coded in the BDPCM mode, variable transform_skip_flag can be inferred to be 1.

FIG. 8 shows an exemplary syntax including a part of a residual coding syntax, according to some embodiments of the present disclosure. As shown in FIG. 8, changes from the previous VVC are shown in bold italics, with proposed deleted syntax being further shown in strikethrough. For example, if variable transform_skip_flag is equal to 1, the sign data hiding is disabled. Moreover, the redundant condition checking of variable ph_dep_quant_enabled_flag can be removed. According to the VVC specification, there is no valid case where both of the flags pic_sign_data hiding_enabled_flag and ph_dep_quant_enabled_flag have a value of 1.

In some embodiments, SDH is disabled if a block is coded in BDPCM mode (e.g., variable BdpcmFlag is equal to 1) regardless of the value of variable slice_ts_residual_coding_disabled_flag. However, the SDH of TS blocks with non-BDPCM modes can be allowed if variable slice_ts_residual_coding_disabled_flag is equal to 1. If slice_ts_residual_coding_disabled_flag is equal to 0, the SDH of TS blocks (with or without BDPCM) are disabled. FIG. 9 shows an exemplary table including conditions to allow sign data hiding for transform-skip mode and block differential pulse-code modulation mode, according to some embodiments of the present disclosure. As shown in FIG. 9, in non-BDPCM mode (e.g., variable BdpcmFlag is equal to 0), the SDH can be enabled if variable slice_ts_residual_coding_disabled_flag is equal to 1.

FIG. 10 shows an exemplary syntax including a part of a residual coding syntax for conditions shown in FIG. 9, according to some embodiments of the present disclosure. As shown in FIG. 10, changes from the previous VVC are shown in bold italics, with proposed deleted syntax being further shown in strikethrough. For example, if BdpcmFlag is equal to 0, the SDH is disabled (e.g., signHidden is equal to 0). Moreover, the redundant condition checking of variable ph_dep_quant_enabled_flag can be removed from the syntax.

In some embodiments, sign data hiding is disabled for all coded blocks (e.g., both TS and non-TS blocks) if variable slice_ts_residual_coding_disabled_flag is equal to 1. This is because when variable slice_ts_residual_coding_disabled_flag is equal to 1, it is more likely that the slice is meant to be coded in the lossless mode, in which case the SDH may not be suitable. FIG. 11 shows an exemplary syntax including a part of a residual coding syntax for disabling sign data hiding, according to some embodiments of the present disclosure. As shown in FIG. 11, changes from the previous VVC are shown in bold italics, with proposed deleted syntax being further shown in strikethrough. For example, when variable slice_ts_residual_coding_disabled_flag is equal to 1, SDH is disabled.

In some embodiments, a slice level sign data hiding flag (e.g., variable slice_sign_data_hiding_enabled_flag) can be introduced to control sign data hiding of a slice. For example, if variable slice_sign_data_hiding_enabled_flag is equal to 0, sign bit hiding is disabled for the current slice. If variable slice_sign_data_hiding_enabled_flag is equal to 1, sign bit hiding is enabled for the current slice. In some embodiments, when variable slice_sign_data_hiding_enabled_flag is not present, it is inferred to be equal to 0.

In some embodiments, for a given slice, both sign data hiding and slice_ts_residual_coding_disabled_flag=1 is disabled. More specifically, the following combinations are not allowed:

a. slice_sign_data_hiding_enabled_flag is equal to 1 AND
b. slice_ts_residual_coding_disabled_flag is equal to 1

In some embodiments, variable slice_sign_data_hiding_enabled_flag is signaled if both of the following conditions are satisfied: 1) variable pic_sign_data_hiding_enabled_flag is equal to 1, meaning that the current picture allows SDH, and 2) slice_ts_residual_coding_disabled_flag is equal to 0, meaning that the slice is likely coded in lossy mode, where SDH can be a useful tool.

FIG. 12 shows an exemplary syntax including a part of a slice header syntax for control of slice level sign data hiding flag, according to some embodiments of the present disclosure. As shown in FIG. 10, changes from the previous VVC are shown in bold italics. For example, as shown in FIG. 10, the new variable slice_sign_data_hiding_enabled_flag is added.

In some embodiments, the slice level slice_ts_residual_coding_disabled_flag is signaled if slice_sign_data_hiding_enabled_flag is not equal to 1. This is one of the ways to disallow the combinations of both slice_ts_residual_coding_disabled_flag and slice_sign_data_hiding_enabled_flag to be enabled at the same slice.

FIG. 13 shows an exemplary syntax including a part of a residual coding syntax for control of a slice level sign data hiding flag, according to some embodiments of the present disclosure. As shown in FIG. 13, changes from the previous VVC are shown in bold, with proposed deleted syntax being further shown in strikethrough. For example, when variable slice_sign_data_hiding_enabled_flag is equal to 0, SDH is disabled, regardless of the values of variables ph_dep_quant_enabled_flag or pic_sign_data_hiding_enabled_flag.

In some embodiments, variable slice_sign_data_hiding_enabled_flag can be signaled before the signaling of variable slice_ts_residual_coding_disabled_flag, and variable slice_ts_residual_coding_disabled_flag can be conditionally signaled if variable slice_sign_data_hiding_enabled_flag is equal to 0. FIG. 14 shows an exemplary syntax including a part of a slice header syntax for slice level sign data hiding flag, according to some embodiments of the present disclosure. As shown in FIG. 14, changes from the previous VVC are shown in bold. For example, slice_sign_data_hiding_enabled_flag can be set if pic_sign_data_hidnig_enabled_flag is equal to 1. As shown in FIG. 14, the signaling of variable slice_sign_data_hiding_enabled_flag at the slice level is conditioned on variable pic_sign_data_hiding_enabled_flag at the picture level. Moreover, the signaling of variable slice_ts_residual_coding_disabled_flag is conditioned on variable slice_sign_data_hiding_enabled_flag.

In some embodiments, the signaling of variable slice_sign_data_hiding_enabled_flag and the signaling of variable slice_ts_residual_coding_disabled_flag can be processed independent of each other. In other words, the signaling of one is not conditioned upon the signaling of the other. In some embodiments, this may require the encoder to send variable slice_sign_data_hiding_enabled_flag of value 0 even though the encoder is already in lossless mode. As a result, syntax redundancy may be created. Nevertheless, this can create future flexibility to use regular residual coding and SDH together for TS and BDPCM blocks to improve lossy coding efficiency.

In some embodiments, the slice level variable slice_ts_residual_coding_disabled_flag can be replaced with a slice level lossless variable, namely slice_lossless_flag. In some embodiments, a value of 1 for the variable slice_lossless_flag indicates that the current slice is lossless coded and all of the residual blocks of that slice use residual_coding( ) syntax to parse the residual sample. A value of 0 for variable slice_lossless_flag indicates that the current slice is not lossless coded. In some embodiments, when variable slice_lossless_flag is not present, it is inferred to be equal to 0.

FIG. 15 shows an exemplary syntax including a part of a slice header syntax for a slice level lossless flag, according to some embodiments of the present disclosure. As shown in FIG. 15, changes from the previous VVC are shown in bold italics, with proposed deleted syntax being further shown in strikethrough. For example, variable slice_lossless_flag is added and incorporated into the syntax. The variable slice_lossless_flag is signaled after signaling of the slice type. If variable slice_lossless_flag is equal to be 1, some or all of the loop filters (e.g., adaptive loop filter, sample adaptive offset, deblocking filter and luma mapping with chroma scaling) can be disabled for the lossless slice. For example, if variable slice_lossless_flag is equal to 1, variables slice_alf_enabled_flag, slice_sao_luma_flag, slice_deblocking_filter_override_flag, and slice_limes_enabled_flag are not signaled.

FIG. 16 shows an exemplary syntax including a part of a residual coding syntax for a slice level lossless flag, according to some embodiments of the present disclosure. As shown in FIG. 16, changes from the previous VVC are shown in bold italics, with proposed deleted syntax being further shown in strikethrough. For example, variable slice_lossless_flag is added and incorporated into the syntax. In some embodiments, as shown in FIG. 16, variable slice_lossless_flag can replace variable slice_ts_residual_coding_disabled_flag in determining the conditions for residual coding.

In some embodiments, the values of variables pic_sign_data_hiding_enabled_flag and slice_ts_residual_coding_disabled_flag cannot be both equal to 1. When pic_sign_data_hiding_enabled_flag is equal to 1, the codec most likely are operating in a lossy mode, and the possibility of using variable slice_is_residual_coding_disabled_flag being equal to 0 is very high in a loss compression. As a result, to reduce the syntax redundancy, if variable pic_sign- _data_hiding_enabled_flag is equal to 1, variable slice_ts_residual_coding_disabled_flag can be inferred to be 0. Variable slice_ts_residual_coding_disabled_flag is only signaled if variable pic_sign_data_hiding_enabled_flag is equal to 0. FIG. 17 shows an exemplary syntax including a part of a slice heading syntax with reduced syntax redundancy, according to some embodiments of the present disclosure. As shown in FIG. 17, changes from the previous VVC are shown in bold italics. For example, when variable pic_sign_data hiding_enabled_flag is equal to 0, variable slice_ts_residual_coding_disabled_flag is equal to 1.

In some embodiments, for a given picture, sign data hiding and dependent quantization cannot be supported at the same time. As a result, variables ph_dep_quant_enabled_flag and pic_sign data_hiding_enabled_flag may not be equal to 1 at the same time. To avoid this combination, if variable ph_dep_quant_enabled_flag is equal to 1, variable slice_ts_residual_coding_disabled_flag is signaled. FIG. 18 shows an exemplary syntax including a part of a slice header syntax for conditions of sign data hiding and dependent quantization, according to some embodiments of the present disclosure. As shown in FIG. 18, changes from the previous VVC are shown in bold italics. For example, as shown in FIG. 18, when variable ph_dep_quant_enabled_flag is equal to 1, variable slice_ts_residual_coding_disabled_flag is signaled.

In some embodiments, for a given slice, dependent quantization and slice_ts_residual_coding_disabled_flag==1 cannot be supported at the same time. To avoid this combination, if variable ph_dep_quant_enabled_flag is equal to 1, variable slice_ts_residual_coding_disabled_flag is not signaled.

Figure 19:
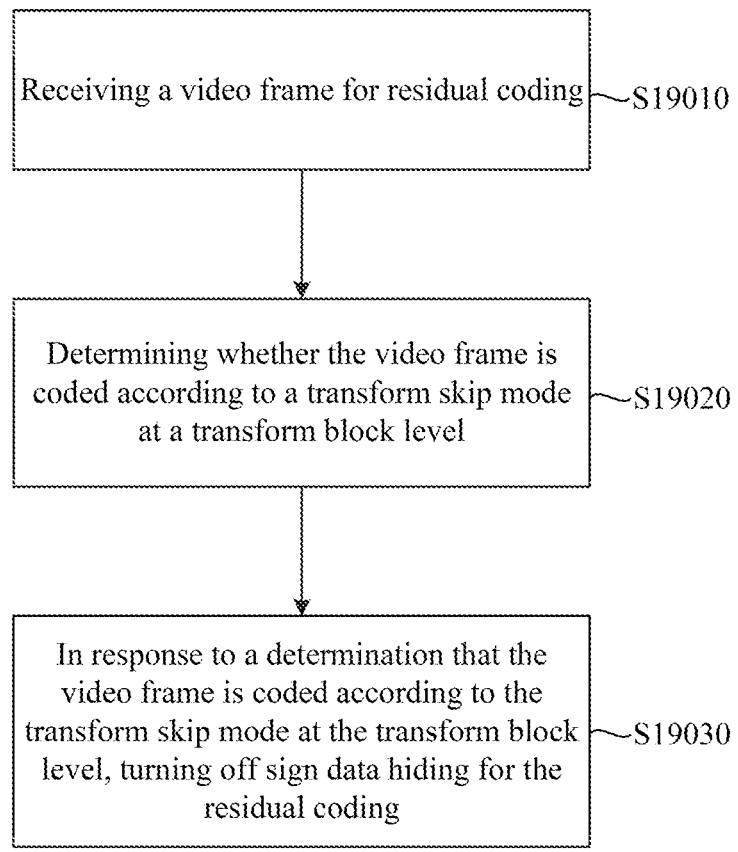
FIG. 19 shows a flowchart of an example video coding method with transform skip mode and sign data hiding, according to some embodiments of the present disclosure.

In some embodiment, slice_ts_residual_coding_disabled_flag is signlled if both of the slice_sign data_hiding_enabled_flag and ph_dep_quant_enabled_flag are non-zero values. More specifically.
    if (!slice_sign_data_hiding_enabled_flag && !ph_dep_quant_enabled_flag)
    signal_residual_coding_disabled_flag Embodiments of the present disclosure further provide methods for performing video coding. FIG. 19 shows a flowchart of an example video coding method with transform skip mode and sign data hiding, according to some embodiments of the present disclosure. In some embodiments, method 19000 shown in FIG. 19 can be performed by apparatus 400 shown in FIG. 4. In some embodiments, method 19000 shown in FIG. 19 can be executed according to the syntax shown in FIG. 8. In some embodiments, method 19000 shown in FIG. 19 is performed according to the VVC standard.

In step S19010, a video frame is received for coding. In some embodiments, the video frame is in a bitstream. In some embodiments, the video frame is received for residual coding.

In step S19020, it is determined whether the video frame is coded according to a transform skip mode at a transform block level. For example, as shown in FIG. 8, a variable transform_skip_flag can be used to determine if the video frame is coded according to a transform skip mode at a transform block level.

In step S19030, in response to a determination that the video frame is coded according to the transform skip mode at the transform block level, sign data hiding is turned off for the residual coding. For example, as shown in FIG. 8, when variable transform_skip_flag is equal to 0, variable signHidden is set to 0. As a result, sign data hiding is turned off for the residual coding. In some embodiments, turning off sign data hiding for the residual coding is not dependent on whether a dependent quantization is enabled for the video frame. For example, as shown in FIG. 8, variable ph_dep_quant_enabled_flag is removed from the conditions for variable signHidden. In other words, value of signHidden is not dependent on variable ph_dep_quant_enabled_flag. In some embodiments, turning off sign data hiding for both TS with non-BDPCM blocks and TS with BDPCM blocks can increase the efficiency of the compression performance. For example, the error propagation shown in FIG. 6 may be removed by turning off the sign data hiding.

Figure 20:
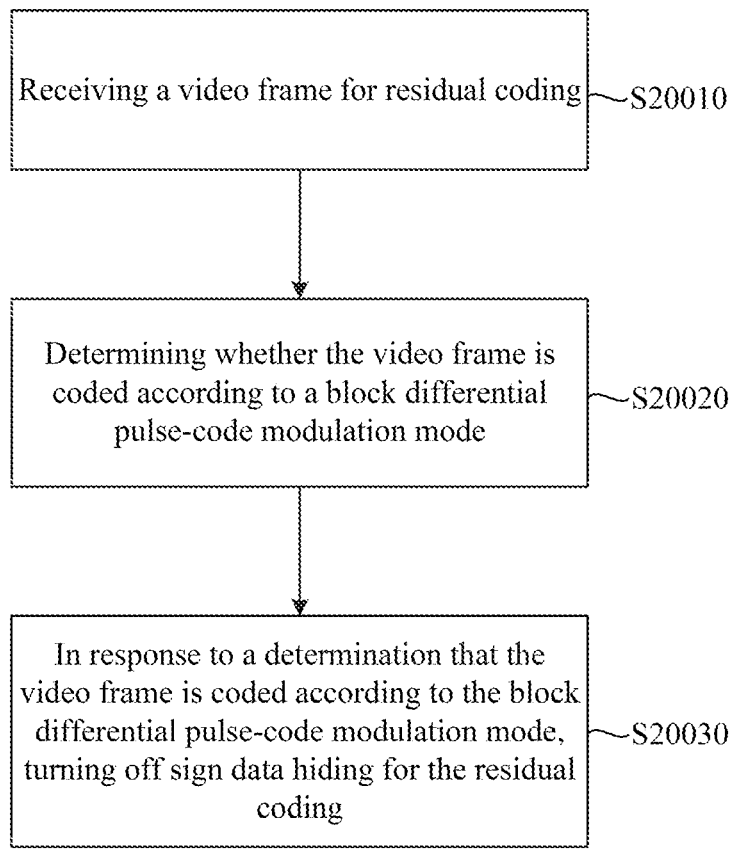
FIG. 20 shows a flowchart of an example video coding method with block differential pulse-code modulation mode and sign data hiding, according to some embodiments of the present disclosure.

FIG. 20 shows a flowchart of an example video coding method with block differential pulse-code modulation mode and sign data hiding, according to some embodiments of the present disclosure. In some embodiments, method 20000 shown in FIG. 20 can be performed by apparatus 400 shown in FIG. 4. In some embodiments, method 20000 shown in FIG. 20 can be executed according to the syntax shown in FIG. 10. In some embodiments, method 20000 shown in FIG. 20 is performed according to the VVC standard.

In step S20010, a video frame is received for coding. In some embodiments, the video frame is in a bitstream. In some embodiments, the video frame is received for residual coding.

In step S20020, it is determined whether the video frame is coded according to a block differential pulse-code modulation mode. In some embodiments, it is determined whether the video frame is coded according to the block differential pulse-code modulation mode at a block level. For example, as shown in FIG. 10, variable BdpcmFlag can be used to determine if the video frame is coded according to the block differential pulse-code modulation mode at a block level.

In step S20030, in response to a determination that the video frame is coded according to the block differential pulse-code modulation mode, sign data hiding is turned off for the residual coding. For example, as shown in FIG. 10, when variable BdpcmFlag is equal to 0, variable signHidden is set to 0. As a result, sign data hiding is turned off for the residual coding. In some embodiments, turning off sign data hiding for the residual coding is not dependent on whether a dependent quantization is enabled for the video frame. For example, as shown in FIG. 10, variable ph_dep_quant_enabled_flag is removed from the conditions for variable signHidden. In other words, value of signHidden is not dependent on variable ph_dep_quant_enabled_flag. In some embodiments, turning off sign data hiding for TS with BDPCM blocks can increase the efficiency of the compression performance. For example, the error propagation shown in FIG. 6 may be removed by turning off the sign data hiding.

Figure 21:
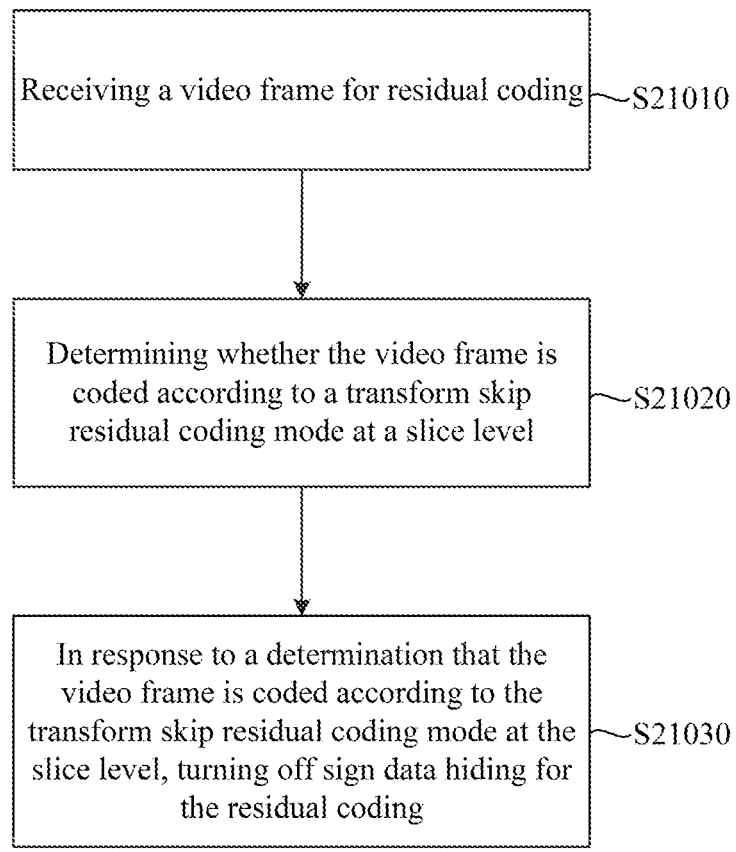
FIG. 21 shows a flowchart of an example video coding method with transform skip residual coding and sign data hiding, according to some embodiments of the present disclosure.

FIG. 21 shows a flowchart of an example video coding method with transform skip residual coding and sign data hiding, according to some embodiments of the present disclosure. In some embodiments, method 21000 shown in FIG. 21 can be performed by apparatus 400 shown in FIG. 4. In some embodiments, method 21000 shown in FIG. 21 can be executed according to the syntax shown in FIG. 11. In some embodiments, method 21000 shown in FIG. 21 is performed according to the VVC standard.

In step S21010, a video frame is received for coding. In some embodiments, the video frame is in a bitstream. In some embodiments, the video frame is received for residual coding.

In step S21020, it is determined whether the video frame is coded according to a transform skip residual coding mode at a slice level. For example, as shown in FIG. 11, variable slice_ts_residual_coding_disabled_flag can be used to determine if the video frame is coded according to the transform skip residual coding mode at a slice level.

In step S21030, in response to a determination that the video frame is not coded according to the transform skip residual coding mode at the slice level, sign data hiding is turned off for the residual coding. For example, as shown in FIG. 11, when variable slice_ts_residual_coding_disabled_flag is equal to 1, it is determined that the video frame is not coded according to the transform skip residual coding mode at the slice level. As a result, variable signHidden is set to 0, and sign data hiding is turned off for the residual coding. In some embodiments, turning off sign data hiding for the residual coding is not dependent on whether a dependent quantization is enabled for the video frame. For example, as shown in FIG. 11, variable ph_dep_quant_enabled_flag is removed from the conditions for variable signHidden. In other words, value of signHidden is not dependent on variable ph_dep_quant_enabled_flag. In some embodiments, sign data hiding is a lossy coding tool. Regular residual coding (e.g., slice_ts_residual_coding_disabled_flag is equal to 1) can achieve more compression gain than the TS residual coding. Therefore, when variable slice_ts_residual_coding_disabled_flag is equal to 1, the compression being performed may be a lossless compression. As a result, sign data hiding can be turned off.

Figure 22:
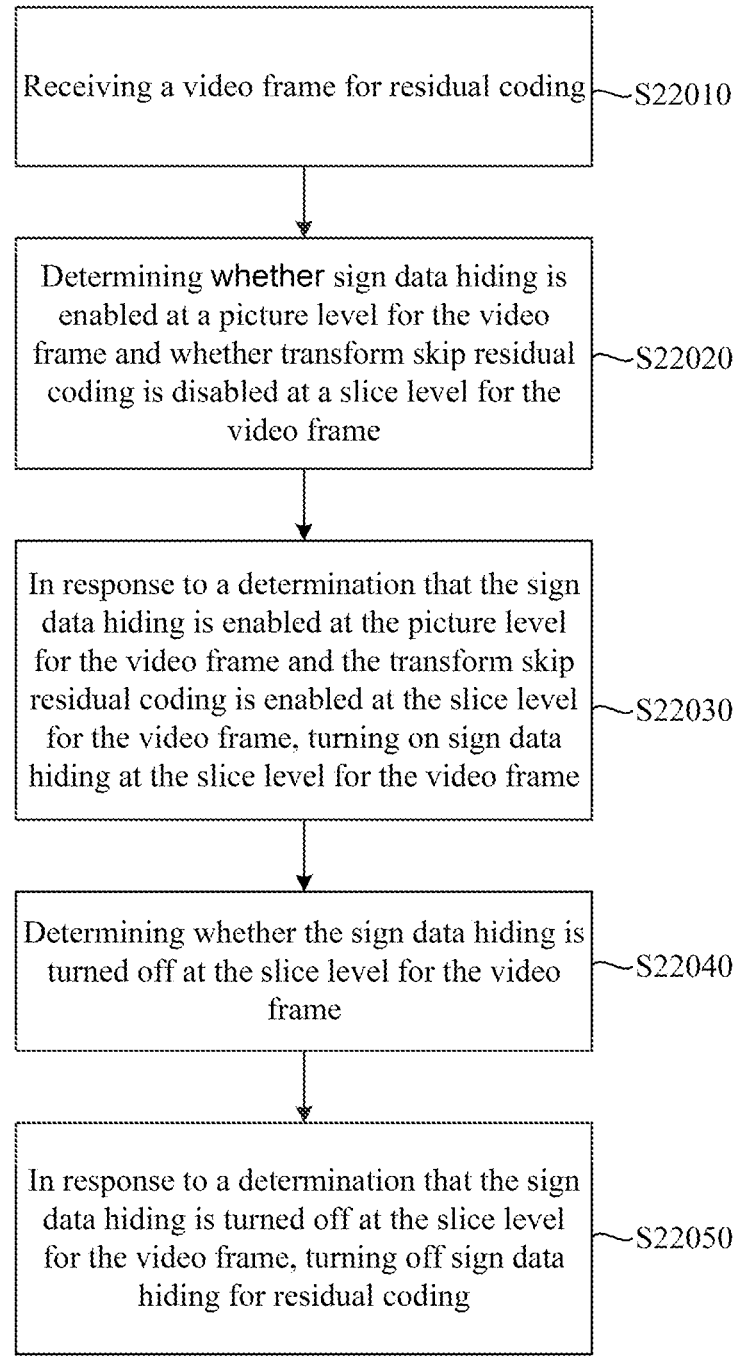
FIG. 22 shows a flowchart of an example video coding method with transform skip residual coding and sign data hiding at a picture level, according to some embodiments of the present disclosure.

FIG. 22 shows a flowchart of an example video coding method with transform skip residual coding and sign data hiding at a picture level, according to some embodiments of the present disclosure. In some embodiments, method 22000 shown in FIG. 22 can be performed by apparatus 400 shown in FIG. 4. In some embodiments, method 22000 shown in FIG. 22 can be executed according to the syntax shown in FIG. 12 or the syntax shown in FIG. 13. In some embodiments, method 22000 shown in FIG. 22 is performed according to the VVC standard.

In step S22010, a video frame is received for coding. In some embodiments, the video frame is in a bitstream. In some embodiments, the video frame is received for residual coding.

In step S22020, it is determined whether sign data hiding is enabled at a picture level for the video frame and whether transform skip residual coding is disabled at a slice level for the video frame. For example, as shown in FIG. 12, variable pic_sign_data_hiding_enabled_flag can be used to determine if sign data hiding is enabled at a picture level for the video frame, and variable slice_ts_residual_coding_disabled_flag can be used to determine if the video frame is coded according to the transform skip residual coding mode at a slice level for the video frame.

In step S22030, in response to a determination that the sign data hiding is enabled at the picture level for the video frame and the transform skip residual coding is enabled at the slice level for the video frame, sign data hiding is turned on at the slice level for the video frame. For example, as shown in FIG. 12, when variable pic_sign_data_hiding_enabled_flag is equal to 1, it is determined that the sign data hiding is enabled at the picture level for the video frame. Further, when variable slice_ts_residual_coding_disabled_flag is equal to 1, it is determined that the video frame is not coded according to the transform skip residual coding mode at the slice level. As a result, variable slice_sign_data_hiding_enabled_flag is set to 1, and sign data hiding is turned on at the slice level. In some embodiments, sign data hiding is a lossy coding tool. Regular residual coding (e.g., slice_ts_residual_coding_disabled_flag is equal to 1) can achieve more compression gain than the transform skip residual coding. Therefore, transform skip residual coding may be a lossy compression. As a result, sign data hiding can be turned on.

In some embodiments, method 22000 further comprises steps S22040 and S22050. In step S22040, it is determined whether the sign data hiding is turned off at the slice level for the video frame. For example, as shown in FIG. 13, variable slice_sign_data_hiding_enabled_flag can be checked to determine if the sign data hiding is turned off at the slice level for the video frame.

In step S22050, in response to a determination that the sign data hiding is turned off at the slice level for the video frame, sign data hiding is turned off for residual coding. For example, as shown in FIG. 13, when variable slice_sign_data_hiding_enabled_flag is equal to 0, variable signHidden is set to 0, and sign data hiding is turned off for the residual coding. In some embodiments, turning off sign data hiding for the residual coding is not dependent on whether a dependent quantization is enabled for the video frame. For example, as shown in FIG. 13, variable ph_dep_quant_enabled_flag is removed from the conditions for variable signHidden. In other words, value of signHidden is not dependent on variable ph_dep_quant_enabled_flag.

Figure 23:
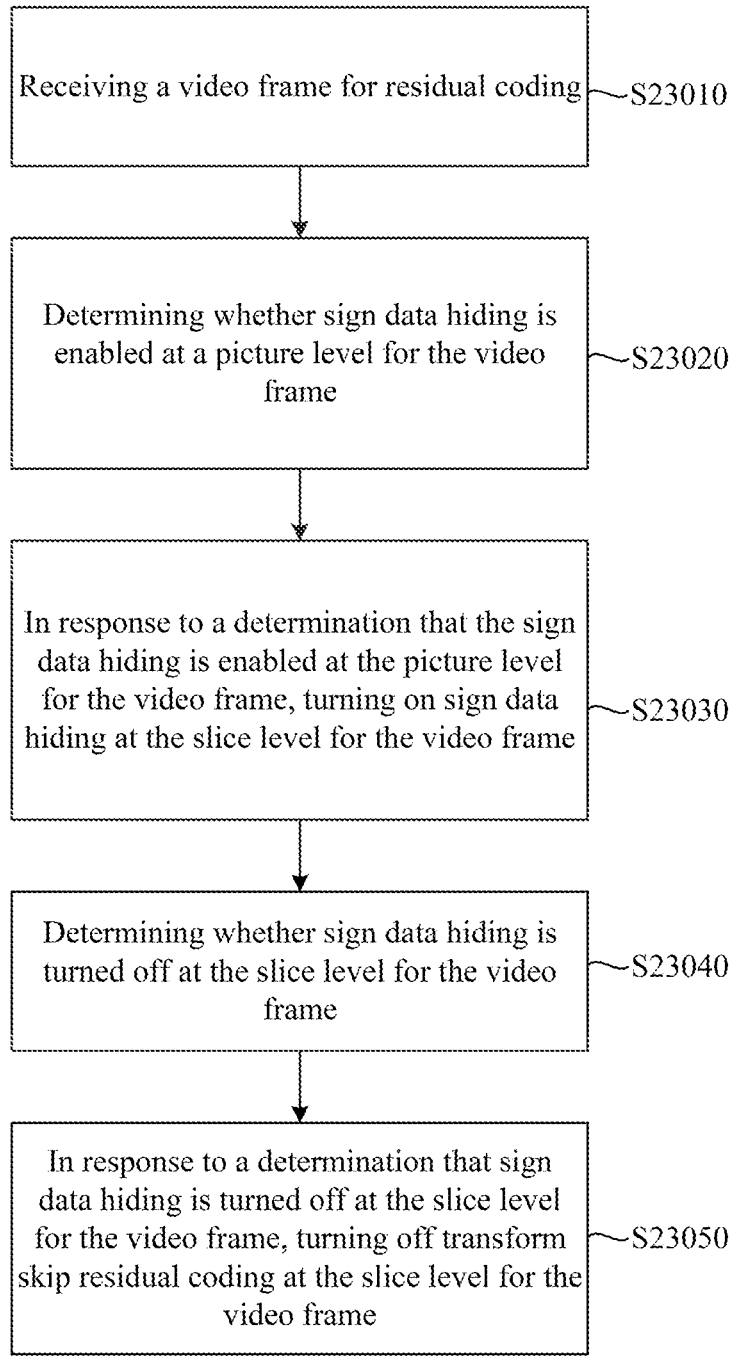
FIG. 23 shows a flowchart of an example video coding method with sign data hiding at a picture level, sign data hiding at a slice level, and transform skip residual coding at a slice level, according to some embodiments of the present disclosure.

FIG. 23 shows a flowchart of an example video coding method with sign data hiding at a picture level, sign data hiding at a slice level, and transform skip residual coding at a slice level, according to some embodiments of the present disclosure. In some embodiments, method 23000 shown in FIG. 23 can be performed by apparatus 400 shown in FIG. 4. In some embodiments, method 23000 shown in FIG. 23 can be executed according to the syntax shown in FIG. 14. In some embodiments, method 23000 shown in FIG. 23 is performed according to the VVC standard.

In step S23010, a video frame is received for coding. In some embodiments, the video frame is in a bitstream. In some embodiments, the video frame is received for residual coding.

In step S23020, it is determined whether sign data hiding is enabled at a picture level for the video frame. For example, as shown in FIG. 14, variable pic_sign_data_hiding_enabled_flag can be used to determine if sign data hiding is enabled at a picture level for the video frame.

In step S23030, in response to a determination that the sign data hiding is enabled at the picture level for the video frame, sign data hiding is turned on at the slice level for the video frame. For example, as shown in FIG. 14, when variable pic_sign_data_hiding_enabled_flag is equal to 1, it is determined that the sign data hiding is enabled at the picture level for the video frame. As a result, variable slice_sign_data_hiding_enabled_flag is set to 1, and sign data hiding is turned on at the slice level.

In step S23040, it is determined whether sign data hiding is turned off at the slice level for the video frame. For example, as shown in FIG. 14, variable slice_sign_data_hiding_enabled_flag is checked to determine if sign data hiding is turned off at the slice level for the video frame.

In step S23050, in response to a determination that sign data hiding is turned off at the slice level for the video frame, transform skip residual coding is turned off at the slice level for the video frame. For example, as shown in FIG. 14, if variable slice_sign_data_hiding_enabled_flag is equal to 0, variable slice_ts_residual_coding_disabled_flag is set to 1, and transform skip residual coding is turned off at the slice level for the video frame. In some embodiments, sign data hiding is a lossy coding tool. Regular residual coding (e.g., slice_ts_residual_coding_disabled_flag is equal to 1) can achieve more compression gain than the transform skip residual coding. Therefore, transform skip residual coding may be a lossy compression. When sign data hiding is turned off, transform skip residual coding at the slice level can also be turned off.

Figure 24:
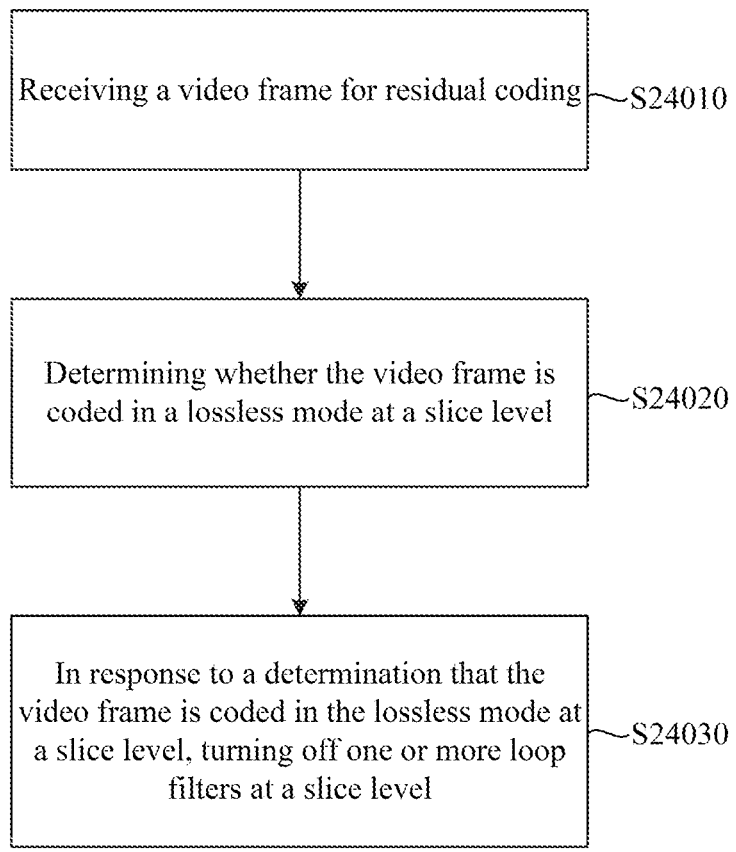
FIG. 24 shows a flowchart of an example video coding method with lossless coding mode and sign data hiding, according to some embodiments of the present disclosure.

FIG. 24 shows a flowchart of an example video coding method with lossless coding mode and sign data hiding, according to some embodiments of the present disclosure. In some embodiments, method 24000 shown in FIG. 24 can be performed by apparatus 400 shown in FIG. 4. In some embodiments, method 24000 shown in FIG. 24 can be executed according to the syntax shown in FIG. 15 or the syntax shown in FIG. 16. In some embodiments, method 24000 shown in FIG. 24 is performed according to the VVC standard.

In step S24010, a video frame is received for coding. In some embodiments, the video frame is in a bitstream. In some embodiments, the video frame is received for residual coding.

In step S24020, it is determined whether the video frame is coded in a lossless mode. In some embodiments, it is determined whether the video frame is coded in a lossless mode at a slice level. For example, as shown in FIG. 15, variable slice_lossless_flag can be used to determine if the video frame is coded in the lossless mode at the slice level.

In step S24030, in response to a determination that the video frame is coded in the lossless mode at the slice level, one or more loop filters are turned off at a slice level. For example, as shown in FIG. 15, variables slice_alf_enabled_flag, slice_sao_luma_flag, slice_deblocking_filter_override_flag, and slice_lmes_enabled_flag are not signaled if variable slice_lossless_flag is equal to 1. In some embodiments, turning off the one or more loop filters can make the video coding more efficient.

Figure 25:
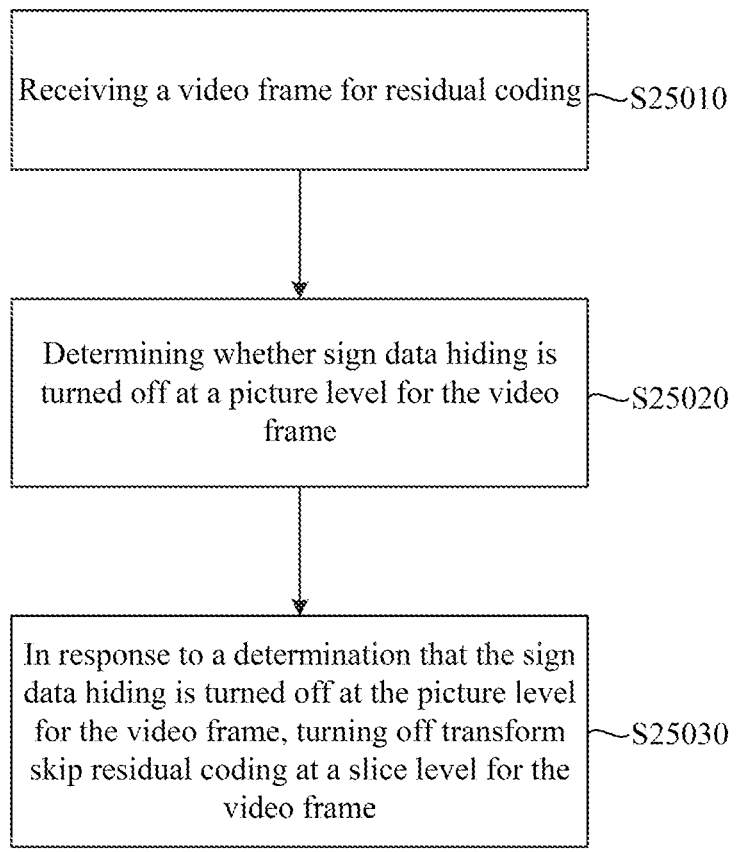
FIG. 25 shows a flowchart of an example video coding method with sign data hiding at a picture level and transform skip residual coding at a slice level, according to some embodiments of the present disclosure.

FIG. 25 shows a flowchart of an example video coding method with sign data hiding at a picture level and transform skip residual coding at a slice level, according to some embodiments of the present disclosure. In some embodiments, method 25000 shown in FIG. 25 can be performed by apparatus 400 shown in FIG. 4. In some embodiments, method 25000 shown in FIG. 25 can be executed according to the syntax shown in FIG. 17. In some embodiments, method 25000 shown in FIG. 25 is performed according to the VVC standard.

In step S25010, a video frame is received for coding. In some embodiments, the video frame is in a bitstream. In some embodiments, the video frame is received for residual coding.

In step S25020, it is determined whether sign data hiding is turned off at a picture level for the video frame. For example, as shown in FIG. 17, variable pic_sign_data_hiding_enabled_flag can be used to determine if the sign data hiding is turned off at the picture level for the video frame.

In step S25030, in response to a determination that the sign data hiding is turned off at the picture level for the video frame, transform skip residual coding is turned off at a slice level for the video frame. For example, as shown in FIG. 17, variable pic_sign_data_hiding_enabled_flag is checked. If variable pic_sign_data_hiding_enabled_flag is equal to 0, variable slice_ts_residual_coding_disabled_flag is signaled. As a result, transform skip residual coding is turned off at the slice level for the video frame. In some embodiments, the combination of the regular residual coding (e.g., slice_ts_residual_coding_disabled_flag==1) with sign data hiding (e.g., pic_sign_data_hiding_enabled_flag=1) is not useful configuration. Therefore, disallowing this combination can reduce syntax redundancy.

Figure 26:
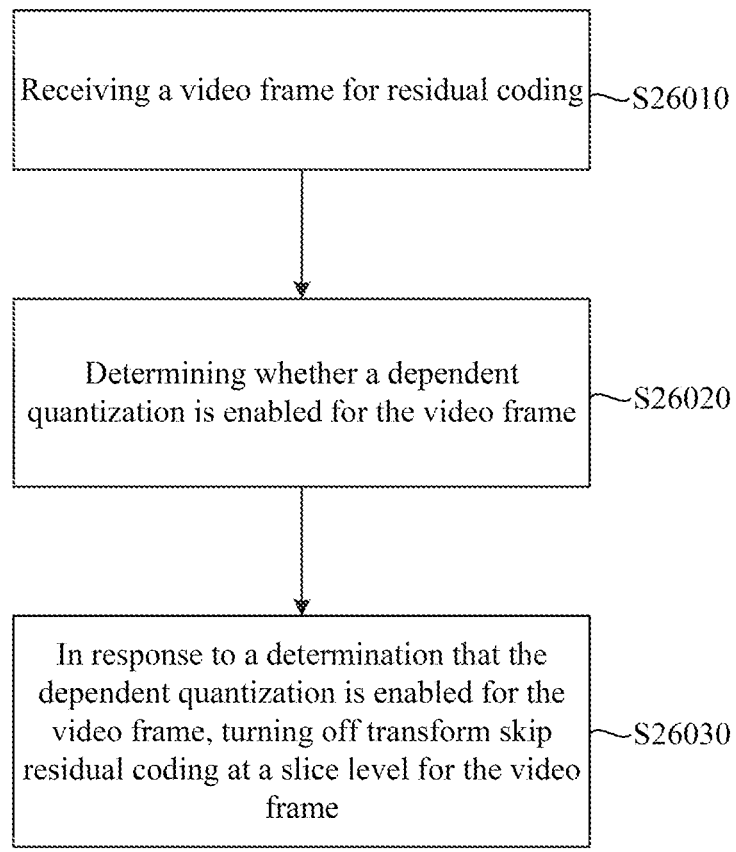
FIG. 26 shows a flowchart of an example video coding method with dependent quantization and transform skip residual coding at a slice level, according to some embodiments of the present disclosure.

FIG. 26 shows a flowchart of an example video coding method with dependent quantization and transform skip residual coding at a slice level, according to some embodiments of the present disclosure. In some embodiments, method 26000 shown in FIG. 26 can be performed by apparatus 400 shown in FIG. 4. In some embodiments, method 26000 shown in FIG. 26 can be executed according to the syntax shown in FIG. 18. In some embodiments, method 26000 shown in FIG. 26 is performed according to the VVC standard.

In step S26010, a video frame is received for coding. In some embodiments, the video frame is in a bitstream. In some embodiments, the video frame is received for residual coding.

In step S26020, it is determined whether a dependent quantization is enabled for the video frame. For example, as shown in FIG. 18, variable ph_dep_quant_enabled_flag can be used to determine if the dependent quantization is enabled for the video frame.

In step S26030, in response to a determination that the dependent quantization is enabled for the video frame, transform skip residual coding is turned off at a slice level for the video frame. For example, as shown in FIG. 18, variable ph_dep_quant_enabled_flag is checked. If variable ph_dep_quant_enabled_flag is equal to 1, variable slice_ts_residual_coding_disabled_flag is signaled. As a result, transform skip residual coding is turned off at the slice level for the video frame. In some embodiments, the combination of the regular residual coding (e.g., slice_ts_residual_coding_disabled_flag==1) with sign_data_hiding (e.g., pic_sign_data_hiding_enabled_flag=1) is not useful configuration. Therefore, disallowing this combination can reduce syntax redundancy.

In some embodiments, a non-transitory computer-readable storage medium including instructions is also provided, and the instructions may be executed by a device (such as the disclosed encoder and decoder), for performing the above-described methods. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same. The device may include one or more processors (CPUs), an input/output interface, a network interface, and/or a memory.

It should be noted that, the relational terms herein such as "first" and "second" are used only to differentiate an entity or operation from another entity or operation, and do not require or imply any actual relationship or sequence between these entities or operations. Moreover, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

It is appreciated that the above-described embodiments can be implemented by hardware, or software (program codes), or a combination of hardware and software. If implemented by software, it may be stored in the above-described computer-readable media. The software, when executed by the processor can perform the disclosed methods. The computing units and other functional units described in this disclosure can be implemented by hardware, or software, or a combination of hardware and software. One of ordinary skill in the art will also understand that multiple ones of the above-described modules/units may be combined as one module/unit, and each of the above-described modules/units may be further divided into a plurality of sub-modules/sub-units.

In the foregoing specification, embodiments have been described with reference to numerous specific details that can vary from implementation to implementation. Certain adaptations and modifications of the described embodiments can be made. Other embodiments can be apparent to those skilled in the art from consideration of the specification and practice of the invention disclosed herein. It is intended that the specification and examples be considered as exemplary only, with a true scope and spirit of the invention being indicated by the following claims. It is also intended that the sequence of steps shown in figures are only for illustrative purposes and are not intended to be limited to any particular sequence of steps. As such, those skilled in the art can appreciate that these steps can be performed in a different order while implementing the same method.

The embodiments may further be described using the following clauses:

1. A video coding method, comprising:
receiving a video frame for residual coding;
determining whether the video frame is coded according to a transform skip mode at a transform block level; and
in response to a determination that the video frame is coded according to the transform skip mode, turning off sign data hiding for the residual coding.

2. The video coding method of clause 1, wherein turning off sign data hiding for the residual coding is independent from whether a dependent quantization is enabled for the video frame.

3. The video coding method of clause 1, wherein the video frame is in a bitstream.

4. The video coding method of clause 1, wherein the method is performed according to versatile video coding standard.

5. A video coding method, comprising:
receiving a video frame for residual coding;
determining whether the video frame is coded according to a block differential pulse-code modulation mode; and
in response to a determination that the video frame is coded according to the block differential pulse-code modulation code, turning off sign data hiding for the residual coding.

6. The video coding method of clause 5, wherein determining whether the video frame is coded according to a block differential pulse-code modulation mode further comprises:
determining whether the video frame is coded according to the block differential pulse-code modulation mode at a block level.

7. The video coding method of clause 5, wherein turning off sign data hiding for the residual coding is independent from whether a dependent quantization is enabled for the video frame.

8. The video coding method of clause 5, wherein the video frame is in a bitstream.

9. The video coding method of clause 5, wherein the method is performed according to versatile video coding standard.

10. A video coding method, comprising:
receiving a video frame for residual coding;
determining whether the video frame is coded according to a transform skip residual coding mode at a slice level; and
in response to a determination that the video frame is not coded according to the transform skip residual coding mode at the slice level, turning off sign data hiding for the residual coding.

11. The video coding method of clause 10, wherein turning off sign data hiding for the residual coding is independent from whether a dependent quantization is enabled for the video frame.

12. The video coding method of clause 10, wherein the video frame is in a bitstream.

13. The video coding method of clause 10, wherein the method is performed according to versatile video coding standard.

14. A video coding method, comprising:
receiving a video frame for residual coding;
determining whether sign data hiding is enabled at a picture level for the video frame and whether transform skip residual coding is disabled at a slice level for the video frame; and
in response to a determination that the sign data hiding is enabled at the picture level for the video frame and the transform skip residual coding is enabled at the slice level for the video frame, turning on sign data hiding at the slice level for the video frame.

15. The video coding method of clause 14, further comprising:
determining whether the sign data hiding is turned off at the slice level for the video frame; and in response to a determination that the sign data hiding is turned off at the slice level for the video frame, turning off sign data hiding for residual coding.

16. The video coding method of clause 14, wherein the video frame is in a bitstream.

17. The video coding method of clause 14, wherein the method is performed according to versatile video coding standard.

18. A video coding method, comprising:
receiving a video frame for residual coding;
determining whether sign data hiding is enabled at a picture level for the video frame;
in response to a determination that the sign data hiding is enabled at the picture level for the video frame, turning on sign data hiding at a slice level for the video frame;
determining whether sign data hiding is turned off at the slice level for the video frame; and
in response to a determination that the sign data hiding is turned off at the slice level for the video frame, turning off transform skip residual coding at the slice level for the video frame.

19. The video coding method of clause 18, wherein the video frame is in a bitstream.

20. The video coding method of clause 18, wherein the method is performed according to versatile video coding standard.

21. A video coding method, comprising:
receiving a video frame for residual coding;
determining whether the video frame is coded in a lossless mode at a slice level; and
in response to a determination that the video frame is coded in the lossless mode at the slice level, turning off one or more loop filters at the slice level.

22. The video coding method of clause 21, wherein the video frame is in a bitstream.

23. The video coding method of clause 21, wherein the method is performed according to versatile video coding standard.

24. A video coding method, comprising:
receiving a video frame for residual coding;
determining whether sign data hiding is turned off at a picture level for the video frame;
in response to a determination that the sign data hiding is turned off at the picture level for the video frame, turning off transform skip residual coding at a slice level for the video frame.

25. The video coding method of clause 24, wherein the video frame is in a bitstream.

26. The video coding method of clause 24, wherein the method is performed according to versatile video coding standard.

27. A video coding method, comprising:
receiving a video frame for residual coding;
determining whether a dependent quantization is enabled for the video frame;
in response to a determination that the dependent quantization is enabled for the video frame, turning off transform skip residual coding at a slice level for the video frame.

28. The video coding method of clause 27, wherein the video frame is in a bitstream.

29. The video coding method of clause 27, wherein the method is performed according to versatile video coding standard.

30. A system for performing video data processing, the system comprising:
a memory storing a set of instructions; and
a processor configured to execute the set of instructions to cause the system to perform:
  receiving a video frame for residual coding;
  determining whether the video frame is coded according to a transform skip mode at a transform block level; and
  in response to a determination that the video frame is coded according to the transform skip mode, turning off sign data hiding for the residual coding.

31. The system of clause 30, wherein turning off sign data hiding for the residual coding is independent from whether a dependent quantization is enabled for the video frame.

32. The system of clause 30, wherein the video frame is in a bitstream.

33. The system of clause 30, wherein the residual coding is performed according to versatile video coding standard.

34. A system for performing video data processing, the system comprising:
a memory storing a set of instructions; and
a processor configured to execute the set of instructions to cause the system to perform:
  receiving a video frame for residual coding;
  determining whether the video frame is coded according to a block differential pulse-code modulation mode; and
  in response to a determination that the video frame is coded according to the block differential pulse-code modulation code, turning off sign data hiding for the residual coding.

35. The system of clause 34, wherein determining the processor is further configured to execute the set of instructions to cause the system to perform;
determining whether the video frame is coded according to the block differential pulse-code modulation mode at a block level.

36. The system of clause 34, wherein turning off sign data hiding for the residual coding is independent from whether a dependent quantization is enabled for the video frame.

37. The system of clause 34, wherein the video frame is in a bitstream.

38. The system of clause 34, wherein the residual coding is performed according to versatile video coding standard.

39. A system for performing video data processing, the system comprising:
a memory storing a set of instructions; and
a processor configured to execute the set of instructions to cause the system to perform:
  receiving a video frame for residual coding;
  determining whether the video frame is coded according to a transform skip residual coding mode at a slice level; and
  in response to a determination that the video frame is not coded according to the transform skip residual coding mode at the slice level, turning off sign data hiding for the residual coding.

40. The system of clause 39, wherein turning off sign data hiding for the residual coding is independent from whether a dependent quantization is enabled for the video frame.

41. The system of clause 39, wherein the video frame is in a bitstream.

42. The system of clause 39, wherein the residual coding is performed according to versatile video coding standard.

43. A system for performing video data processing, the system comprising:
a memory storing a set of instructions; and
a processor configured to execute the set of instructions to cause the system to perform:
  receiving a video frame for residual coding;
  determining whether sign data hiding is enabled at a picture level for the video frame and whether transform skip residual coding is disabled at a slice level for the video frame; and
  in response to a determination that the sign data hiding is enabled at the picture level for the video frame and the transform skip residual coding is enabled at the slice level for the video frame, turning on sign data hiding at the slice level for the video frame.

44. The system of clause 43, wherein the processor is further configured to execute the set of instructions to cause the system to perform:
determining whether the sign data hiding is turned off at the slice level for the video frame; and in response to a determination that the sign data hiding is turned off at the slice level for the video frame, turning off sign data hiding for residual coding.

45. The system of clause 43, wherein the video frame is in a bitstream.

46. The system of clause 43, wherein the residual coding is performed according to versatile video coding standard.

47. A system for performing video data processing, the system comprising:
a memory storing a set of instructions; and
a processor configured to execute the set of instructions to cause the system to perform:
  receiving a video frame for residual coding;
  determining whether sign data hiding is enabled at a picture level for the video frame;
  in response to a determination that the sign data hiding is enabled at the picture level for the video frame, turning on sign data hiding at a slice level for the video frame;
  determining whether sign data hiding is turned off at the slice level for the video frame; and
  in response to a determination that the sign data hiding is turned off at the slice level for the video frame, turning off transform skip residual coding at the slice level for the video frame.

48. The system of clause 47, wherein the video frame is in a bitstream.

49. The system of clause 47, wherein the residual coding is performed according to versatile video coding standard.

50. A system for performing video data processing, the system comprising:
a memory storing a set of instructions; and
a processor configured to execute the set of instructions to cause the system to perform:
  receiving a video frame for residual coding;
  determining whether the video frame is coded in a lossless mode at a slice level; and in response to a determination that the video frame is coded in the lossless mode at the slice level, turning off one or more loop filters at the slice level.

51. The system of clause 50, wherein the video frame is in a bitstream.

52. The system of clause 50, wherein the residual coding is performed according to versatile video coding standard.

53. A system for performing video data processing, the system comprising:
a memory storing a set of instructions; and
a processor configured to execute the set of instructions to cause the system to perform:
  receiving a video frame for residual coding;
  determining whether sign data hiding is turned off at a picture level for the video frame;
  in response to a determination that the sign data hiding is turned off at the picture level for the video frame, turning off transform skip residual coding at a slice level for the video frame.

54. The system of clause 53, wherein the video frame is in a bitstream.

55. The system of clause 54, wherein the residual coding is performed according to versatile video coding standard.

56. A system for performing video data processing, the system comprising:
a memory storing a set of instructions; and
a processor configured to execute the set of instructions to cause the system to perform:
  receiving a video frame for residual coding;
  determining whether a dependent quantization is enabled for the video frame;
  in response to a determination that the dependent quantization is enabled for the video frame, turning off transform skip residual coding at a slice level for the video frame.

57. The system of clause 56, wherein the video frame is in a bitstream.

58. The system of clause 56, wherein the residual coding is performed according to versatile video coding standard.

59. A non-transitory computer readable medium that stores a set of instructions that is executable by one or more processors of an apparatus to cause the apparatus to initiate a method for performing video data processing, the method comprising:
receiving a video frame for residual coding;
determining whether the video frame is coded according to a transform skip mode at a transform block level; and
in response to a determination that the video frame is coded according to the transform skip mode, turning off sign data hiding for the residual coding.

60. The non-transitory computer readable medium of clause 59, wherein turning off sign data hiding for the residual coding is independent from whether a dependent quantization is enabled for the video frame.

61. The non-transitory computer readable medium of clause 59, wherein the video frame is in a bitstream.

62. The non-transitory computer readable medium of clause 59, wherein the method is performed according to versatile video coding standard.

63. A non-transitory computer readable medium that stores a set of instructions that is executable by one or more processors of an apparatus to cause the apparatus to initiate a method for performing video data processing, the method comprising:
receiving a video frame for residual coding;
determining whether the video frame is coded according to a block differential pulse-code modulation mode; and
in response to a determination that the video frame is coded according to the block differential pulse-code modulation code, turning off sign data hiding for the residual coding.

64. The non-transitory computer readable medium of clause 63, wherein the set of instructions is executable by the at least one processor of the computer system to cause the computer system to further perform:
determining whether the video frame is coded according to the block differential pulse-code modulation mode at a block level.

65. The non-transitory computer readable medium of clause 63, wherein turning off sign data hiding for the residual coding is independent from whether a dependent quantization is enabled for the video frame.

66. The non-transitory computer readable medium of clause 63, wherein the video frame is in a bitstream.

67. The non-transitory computer readable medium of clause 63, wherein the method is performed according to versatile video coding standard.

68. A non-transitory computer readable medium that stores a set of instructions that is executable by one or more processors of an apparatus to cause the apparatus to initiate a method for performing video data processing, the method comprising:

receiving a video frame for residual coding;

determining whether the video frame is coded according to a transform skip residual coding mode at a slice level; and in response to a determination that the video frame is not coded according to the transform skip residual coding mode at the slice level, turning off sign data hiding for the residual coding.

69. The non-transitory computer readable medium of clause 68, wherein turning off sign data hiding for the residual coding is independent from whether a dependent quantization is enabled for the video frame.

70. The non-transitory computer readable medium of clause 68, wherein the video frame is in a bitstream.

71. The non-transitory computer readable medium of clause 68, wherein the method is performed according to versatile video coding standard.

72. A non-transitory computer readable medium that stores a set of instructions that is executable by one or more processors of an apparatus to cause the apparatus to initiate a method for performing video data processing, the method comprising:

receiving a video frame for residual coding;

determining whether sign data hiding is enabled at a picture level for the video frame and whether transform skip residual coding is disabled at a slice level for the video frame; and in response to a determination that the sign data hiding is enabled at the picture level for the video frame and the transform skip residual coding is enabled at the slice level for the video frame, turning on sign data hiding at the slice level for the video frame.

73. The non-transitory computer readable medium of clause 72, wherein the set of instructions is executable by the at least one processor of the computer system to cause the computer system to further perform:

determining whether the sign data hiding is turned off at the slice level for the video frame; and in response to a determination that the sign data hiding is turned off at the slice level for the video frame, turning off sign data hiding for residual coding.

74. The non-transitory computer readable medium of clause 72, wherein the video frame is in a bitstream.

75. The non-transitory computer readable medium of clause 72, wherein the method is performed according to versatile video coding standard.

76. A non-transitory computer readable medium that stores a set of instructions that is executable by one or more processors of an apparatus to cause the apparatus to initiate a method for performing video data processing, the method comprising:

receiving a video frame for residual coding:

determining whether sign data hiding is enabled at a picture level for the video frame;

in response to a determination that the sign data hiding is enabled at the picture level for the video frame, turning on sign data hiding at a slice level for the video frame;

determining whether sign data hiding is turned off at the slice level for the video frame; and in response to a determination that the sign data hiding is turned off at the slice level for the video frame, turning off transform skip residual coding at the slice level for the video frame.

77. The non-transitory computer readable medium of clause 76, wherein the video frame is in a bitstream.

78. The non-transitory computer readable medium of clause 76, wherein the method is performed according to versatile video coding standard.

79. A non-transitory computer readable medium that stores a set of instructions that is executable by one or more processors of an apparatus to cause the apparatus to initiate a method for performing video data processing, the method comprising:

receiving a video frame for residual coding;

determining whether the video frame is coded in a lossless mode at a slice level; and in response to a determination that the video frame is coded in the lossless mode at the slice level, turning off one or more loop filters at the slice level.

80. The non-transitory computer readable medium of clause 79, wherein the video frame is in a bitstream.

81. The non-transitory computer readable medium of clause 79, wherein the method is performed according to versatile video coding standard.

82. A non-transitory computer readable medium that stores a set of instructions that is executable by one or more processors of an apparatus to cause the apparatus to initiate a method for performing video data processing, the method comprising:

receiving a video frame for residual coding;

determining whether sign data hiding is turned off at a picture level for the video frame;

in response to a determination that the sign data hiding is turned off at the picture level for the video frame, turning off transform skip residual coding at a slice level for the video frame.

83. The non-transitory computer readable medium of clause 82, wherein the video frame is in a bitstream.

84. The non-transitory computer readable medium of clause 82, wherein the method is performed according to versatile video coding standard.

85. A non-transitory computer readable medium that stores a set of instructions that is executable by one or more processors of an apparatus to cause the apparatus to initiate a method for performing video data processing, the method comprising:

receiving a video frame for residual coding;

determining whether a dependent quantization is enabled for the video frame;

in response to a determination that the dependent quantization is enabled for the video frame, turning off transform skip residual coding at a slice level for the video frame.

86. The non-transitory computer readable medium of clause 85, wherein the video frame is in a bitstream.

87. The non-transitory computer readable medium of clause 85, wherein the method is performed according to versatile video coding standard.

In the drawings and specification, there have been disclosed exemplary embodiments. However, many variations and modifications can be made to these embodiments. Accordingly, although specific terms are employed, they are used in a generic and descriptive sense only and not for purposes of limitation.

What is claimed is:

1. A method of encoding a video sequence into a bitstream, the method comprising:

receiving a video frame for residual coding;

encoding a first flag into a bitstream, the first flag indicating whether sign data hiding is turned off at a slice level for the video frame; and determining, based on a value of the first flag, whether to skip encoding a second flag indicating whether transform skip residual coding is turned off at the slice level for the video frame.

2. The method of claim 1, wherein the method is performed according to versatile video coding standard.

3. The method of claim 1, wherein the first flag comprises a slice level flag of slice_sign_data_hiding_enabled_flag.

4. The method of claim 1, wherein the second flag comprises a slice level flag of slice_ts_residual_coding_disabled_flag.

5. The method of claim 1, further comprising:
in response to the value of the first flag indicating the sign data hiding is turned off at the slice level for the video frame, encoding the second flag into the bitstream.

6. The method of claim 1, further comprising:
in response to the value of the first flag being equal to 0, encoding the second flag into the bitstream.

7. The method of claim 1, further comprising:
in response to the value of the first flag being equal to 1, skipping encoding the second flag.

8. A method of decoding a bitstream to output one or more pictures for a video stream, the method comprising:
receiving a bitstream encoded based on residual coding, the bitstream comprising a first flag indicating whether sign data hiding is turned off at a slice level;
decoding the first flag; and
determining, based on a value of the first flag, whether to decode a second flag indicating whether transform skip residual coding is turned off at the slice level.

9. The method of claim 8, wherein the first flag comprises a slice level flag of slice_sign_data_hiding_enabled_flag.

10. The method of claim 8, wherein the second flag comprises a slice level flag of slice_ts_residual_coding_disabled_flag.

11. The method of claim 8, further comprising:
in response to the value of the first flag indicating the sign data hiding is turned off at the slice level, decoding the second flag.

12. The method of claim 8, further comprising:
in response to the value of the first flag being equal to 0, decoding the second flag.

13. The method of claim 8, further comprising:
in response to the value of the first flag being equal to 1, skipping decoding the second flag and determining that the transform skip residual coding is turned on at the slice level.

14. The method of claim 8, further comprising:
in response to the value of the first flag being equal to 1, skipping decoding the second flag and determining that a value of the second flag is equal to 0.

15. The method of claim 8, wherein the method is performed according to versatile video coding standard.

16. A non-transitory computer readable storage medium storing a bitstream of a video, the bitstream comprising:
a first flag indicating whether sign data hiding is turned off at a slice level,
wherein when the first flag has a first value, the bitstream further comprises a second flag indicating whether transform skip residual coding is turned off at the slice level, and
wherein when the first flag has a second value, the bitstream further does not comprise the second flag.

17. The non-transitory computer readable storage medium of claim 16, wherein the first flag comprises a slice level flag of slice_sign_data_hiding_enabled_flag.

18. The non-transitory computer readable storage medium of claim 16, wherein the second flag comprises a slice level flag of slice_ts_residual_coding_disabled_flag.

19. The non-transitory computer readable storage medium of claim 16, wherein the first value of the first flag indicates the sign data hiding is turned off at the slice level.

20. The non-transitory computer readable storage medium of claim 16, wherein the first value of the first flag is equal to 0.

21. The non-transitory computer readable storage medium of claim 16, wherein the second value of the first flag indicates the sign data hiding is turned on at the slice level.

22. The non-transitory computer readable storage medium of claim 16, wherein the second value of the first flag is equal to 1.

23. The non-transitory computer readable storage medium of claim 16, wherein the bitstream is encoded according to versatile video coding standard.

* * * * *